（12） United States Patent
Miyanaga et al.

(10) Patent No.: US 8,759,190 B2
(45) Date of Patent: Jun. 24, 2014

(54) CURRENT STEERING ELEMENT AND NON-VOLATILE MEMORY ELEMENT INCORPORATING CURRENT STEERING ELEMENT

(75) Inventors: Ryoko Miyanaga, Nara (JP); Takumi Mikawa, Shiga (JP); Yukio Hayakawa, Kyoto (JP); Takeki Ninomiya, Osaka (JP); Koji Arita, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/823,667

(22) PCT Filed: Sep. 16, 2011

(86) PCT No.: PCT/JP2011/005262
§ 371 (c)(1),
(2), (4) Date: Mar. 14, 2013

(87) PCT Pub. No.: WO2012/035786
PCT Pub. Date: Mar. 22, 2012

(65) Prior Publication Data
US 2013/0171799 A1    Jul. 4, 2013

(30) Foreign Application Priority Data

Sep. 17, 2010  (JP) ................................ 2010-209274

(51) Int. Cl.
*H01L 21/20*  (2006.01)
(52) U.S. Cl.
USPC ......................................... 438/382; 438/667
(58) Field of Classification Search
USPC .................................. 438/382, 667
See application file for complete search history.

(56) References Cited

U.S. PATENT DOCUMENTS

| 2007/0015328 | A1 | 1/2007 | Hsu et al. |
| 2007/0015329 | A1 | 1/2007 | Li et al. |
| 2007/0015330 | A1 | 1/2007 | Li et al. |
| 2007/0015348 | A1 | 1/2007 | Hsu et al. |
| 2007/0284575 | A1 | 12/2007 | Li et al. |
| 2008/0006814 | A1 | 1/2008 | Hsu et al. |

(Continued)

FOREIGN PATENT DOCUMENTS

| JP | 2011-151049 A | 8/2011 |
| WO | WO-2009/139185 A1 | 11/2009 |

OTHER PUBLICATIONS

International Search Report mailed Nov. 15, 2011 issued in corresponding International Application No. PCT/JP2011/005262.

*Primary Examiner* — Marvin Payen
(74) *Attorney, Agent, or Firm* — McDermott Will & Emery LLP

(57) ABSTRACT

A current steering element (100) formed such that the current steering element covers a lower opening (105) of a via hole (104) formed in an interlayer insulating layer (102), comprises: a corrosion-suppressing layer (106) formed on a lower side of a lower opening of the via hole such that the corrosion-suppressing layer covers an entire portion of the lower opening; a second electrode layer (108) formed under the corrosion-suppressing layer and comprising a material different from a material of the corrosion-suppressing layer; a current steering layer (110) formed under the second electrode layer such that the current steering layer is physically in contact with the second electrode layer; and a first electrode layer (112) formed under the current steering layer such that the first electrode layer is physically in contact with the current steering layer; and the first electrode layer, the current steering layer and the second electrode layer constitute one of a MSM diode and a MIM diode.

15 Claims, 19 Drawing Sheets

(56) References Cited

U.S. PATENT DOCUMENTS

| | | |
|---|---|---|
| 2009/0032817 A1 | 2/2009 | Li et al. |
| 2009/0052225 A1 | 2/2009 | Morimoto |
| 2010/0038617 A1 | 2/2010 | Nakajima et al. |
| 2010/0176368 A1 | 7/2010 | Ko et al. |
| 2010/0295012 A1 | 11/2010 | Mikawa et al. |
| 2011/0002155 A1 | 1/2011 | Arita et al. |
| 2011/0210303 A1 | 9/2011 | Muraoka et al. |

CURRENT STEERING ELEMENT AND NON-VOLATILE MEMORY ELEMENT INCORPORATING CURRENT STEERING ELEMENT

RELATED APPLICATIONS

This application is the U.S. National Phase under 35 U.S.C.§371 of International Application No. PCT/JP2011/005262, filed on Sep. 16, 2011, which in turn claims the benefit of Japanese Application No. 2010-209274, filed on Sep. 17, 2010, the disclosures of which Applications are incorporated by reference herein.

TECHNICAL FIELD

The present invention relates to a current steering element having a bidirectional current steering characteristic with respect to an applied voltage, and a non-volatile memory element including the current steering element.

BACKGROUND ART

In recent years, with progresses of digital technologies, electronic devices such as portable information devices and information home appliances have been developed to achieve higher functionalities. With achievement of the higher functionalities of the electronic devices, non-volatile memory devices incorporated into the electronic devices have been developed to provide a larger scale, higher-dense integration and a higher speed. The uses of the non-volatile memory devices have been spreading at a higher pace.

Among them, there has been proposed a non-volatile memory device in which variable resistance elements are arranged in an array form. It is expected that the non-volatile memory device will realize a larger-scale, higher-integration and a higher-speed.

As examples of the variable resistance element, there are a variable resistance element which is writable only once and a variable resistance element which is rewritable. As the variable resistance element which is rewritable, there are two kinds of variable resistance elements. One is a variable resistance element which changes from a higher-resistance state to a lower-resistance state (hereinafter attains the lower-resistance state) and changes from the lower-resistance state to the higher-resistance state (hereinafter attains the higher-resistance state) by application of two electric pulses having the same polarity. This variable resistance element is generally called a unipolar (or mono-polar) variable resistance element. The other is a variable resistance element which attains the lower-resistance state and attains the higher-resistance state by application of two electric pulses which are different in polarity. This variable resistance element is generally called a bipolar variable resistance element.

In a memory device in which the variable resistance elements are arranged in the array form, a current steering element such as a transistor or a steering element is typically connected to each of the variable resistance elements to prevent write disturb due to a bypass current, a cross talk between adjacent memory cells, and the like. Thus, a reliable memory operation is implemented.

Generally, to enable the unipolar variable resistance element to attain the higher-resistance state and the lower-resistance state, two voltages which have the same polarity and are different in magnitude may be used. In a case where a diode is used as the current steering element, a unidirectional diode (diode having a non-linear voltage-current characteristic "ON-OFF characteristic" in a unidirectional voltage polarity, a diode which flows a current in substantially one direction) may be used. Therefore, a structure of a memory cell including a variable resistance element and a current steering element can be simplified. However, the unipolar variable resistance element has a problem that a pulse width of an electric pulse applied in resetting (attaining the higher-resistance state) is great, which makes the element operate at a slow speed.

By comparison, to enable the bipolar variable resistance element to attain the higher-resistance state and attain the lower-resistance state, electric pulses which are short in pulse width may be used, which has an advantage that the bipolar variable resistance element is operative at a higher speed as compared to the unipolar variable resistance element. However, to attain the higher-resistance state and attain the lower-resistance state, it is necessary to use two voltages which are different in polarity. In a case where a diode is used as the current steering element, there causes a need for a bidirectional diode (diode having a non-linear voltage-current characteristic "ON-OFF characteristic" in a bidirectional voltage polarity, a diode which is capable of flowing a current bidirectionally.

Patent Literature 1 discloses a cross-point memory device including a memory cell having a structure in which the bidirectional diode as the current steering element is connected in series with the variable resistance element. As the bidirectional (bipolar) diode, there are known a MIM diode (metal-insulator-metal), a MSM diode (metal-semiconductor-metal), and a varistor disclosed in Patent Literature 1.

FIG. 14 is a view showing a voltage-current characteristic of a general bidirectional diode. Hereinafter, the characteristic of the bidirectional diode and its desired performance will be described with reference to FIG. 14. The bidirectional diode such as the MIM diode, the MSM diode, the varistor, and the like exhibits a non-linear voltage-current characteristic which can be made substantially symmetric by optimizing electrode materials and a material sandwiched between electrodes. That is, it is possible to implement the bidirectional diode in which a change in a current with respect to a positive voltage applied and a change in a current with respect to a negative voltage applied are substantially symmetric with respect to an origin.

In the bidirectional diode, its electric resistance is very high in a range (range C in FIG. 14) in which the applied voltage is equal to or less than a first critical voltage (lower limit voltage in a range A of FIG. 14) and is equal to or greater than a second critical voltage (upper limit voltage in a range B of FIG. 14), and is drastically lowered when the applied voltage is greater than the first critical voltage or less than the second critical voltage. That is, such a two-terminal element has a non-linear electric resistance characteristic (steering characteristic) in which the element does not substantially flow a current when the applied voltage is equal to or greater than the second critical voltage and is equal to or less than the first critical voltage, and flows a current of a great magnitude when the applied voltage is greater than the first critical voltage or is less than the second critical voltage.

By connecting the bidirectional diode in series with the variable resistance element to configure a memory cell, it becomes possible to implement a cross-point non-volatile memory device which performs a bipolar operation and attains a higher speed.

In the variable resistance memory device, the variable resistance element is enabled to attain the higher-resistance state or the lower-resistance state by application of the electric pulse to the variable resistance element, and these resistance states are caused to correspond to data (e.g., 0 and 1), thus writing data to the variable resistance element. In this case, typically, it is necessary to flow a current with a relatively great magnitude through the variable resistance element. Hereinafter, a current required to enable the variable resistance element to attain the higher-resistance state or the lower-resistance state will be referred to as "resistance changing current."

For example, in the memory device disclosed in Patent Literature 1, it is recited that a current with a current density which is equal to or greater than 30000 A/cm$^2$ (about 200 μA for an electrode area of (0.8 μm×0.8 μm)) is flowed in the varistor which is the bidirectional diode when data is written to the variable resistance element.

It is required that the bidirectional diode incorporated into the variable resistance memory device be able to flow a current (allowable current, permissible current) greater than the resistance changing current. If the allowable current of the bidirectional diode is less than the resistance changing current, the resistance state of the element does not change, which causes an incorrect operation.

In a case where data is written to or read from the variable resistance element, it is required that a leak current (OFF-current) be suppressed by using the range A or B (ON-state of the bidirectional diode) in FIG. 14 for a selected memory cell and by using the range C (OFF-state of the bidirectional diode) in FIG. 14 for an unselected memory cell. If the leak current cannot be suppressed satisfactorily, it would become impossible to correctly write and read data to and from the selected memory cell.

Patent Literature 2 discloses a bidirectional Schottky diode in which a semiconductor layer comprises amorphous silicon, polycrystal silicon, $InO_x$, ZnO, and the like, and an electrode which forms a Schottky contact with the semiconductor layer comprises precious metal and metal compound of Pt, Au, Ag, TiN, Ta, Ru, TaN, and the like, and a similar material.

CITATION LISTS

Patent Literature

Patent Literature 1: Japanese Laid-Open Patent Application Publication No. 2006-203098
Patent Literature 2: Japanese Laid-Open Patent Application Publication No. 2007-158325

SUMMARY OF INVENTION

Technical Problem

However, the conventional bidirectional Schottky diode has problems that the voltage-current characteristic is non-uniform among diodes manufactured actually, and thereby low-current defective elements emerge. In a normal element, a current of about 100 μA flows when a voltage of 2V is applied to the element, whereas in a defective element, a current of about 1 nA flows when a voltage of 2V is applied to the element. When the elements which are significantly non-uniform and have a low current drivability are incorporated into a variable resistance memory device as modules, the variable resistance elements connected to the diode elements having a low current drivability do not change their resistances and hence incorrect operation of the elements occur.

The present invention is directed to solving the above described problems, and an object of the present invention is to suppress non-uniformity of voltage-current characteristics among bidirectional current steering elements (elements having good bidirectional steering characteristics with respect to an applied voltage) which can be incorporated into a variable resistance non-volatile memory device, and non-volatile memory elements and a non-volatile memory device including the bidirectional current steering elements.

Solution to Problem

The present inventors intensively studied to solve the above stated problems, in particular, a problem associated with the bidirectional diode in which its allowable current is great in magnitude, that non-uniformity of voltage-current characteristics among bidirectional diodes occurs. As a result, the present inventors found out that electrodes of the diodes were corroded in the middle of manufacturing process steps, which caused the non-uniformity of voltage-current characteristics among the bidirectional diodes, and the elements having a low current drivability emerged. In view of this, non-uniformity of the characteristics can be suppressed, by providing, for example, an electrically-conductive corrosion-suppressing layer between a lower surface of a contact plug filled in a via hole and an upper electrode of the diode.

To achieve the above described object, according to an aspect of the present invention, a method of manufacturing a current steering element comprises the steps of: forming a lower wire; forming a first electrode layer such that the first electrode layer is electrically connected to the lower wire; forming a current steering layer on the first electrode layer such that the current steering layer physically contacts the first electrode layer; forming a second electrode layer on the current steering layer such that the second electrode layer physically contacts the current steering layer; forming a corrosion-suppressing layer on the second electrode layer using a material different from a material of the second electrode layer; forming an interlayer insulating layer such that the interlayer insulating layer covers the corrosion-suppressing layer, the second electrode layer, the current steering layer and the first electrode layer; forming a via hole in the interlayer insulating layer such that an entire portion of a lower opening of the via hole opens on the corrosion-suppressing layer; and washing an interior of the via hole using a washing liquid containing water.

In this configuration, the second electrode layer (upper electrode layer) of the diode is protected by the corrosion-suppressing layer, and the second electrode layer is not exposed in a bottom portion of the via hole. Even when the interior of the via hole is washed in the case where the contact plug connected to the second electrode of the diode is formed, the second electrode layer is protected by the corrosion-suppressing layer and thereby is not corroded. This makes it possible to avoid a problem that non-uniformity of voltage-current characteristics among current steering elements occurs.

According to another aspect of the present invention, a method of manufacturing a current steering element comprises the steps of: forming a lower wire; forming a first electrode layer such that the first electrode layer is electrically connected to the lower wire; forming a current steering layer on the first electrode layer such that the current steering layer physically contacts the first electrode layer; forming a second electrode layer on the current steering layer such that the second electrode layer physically contacts the current steering layer; forming a corrosion-suppressing layer on the second electrode layer using a material different from a material of the second electrode layer; forming an interlayer insulating layer such that the interlayer insulating layer covers the corrosion-suppressing layer, the second electrode layer, the current steering layer and the first electrode layer; forming a trench in the interlayer insulating layer such that the corrosion-suppressing layer is exposed in a lower opening of the trench; and washing an interior of the trench using a washing liquid containing water.

In this configuration, the second electrode layer (upper electrode layer) of the diode is protected by the corrosion-suppressing layer, and the second electrode layer is not exposed in a bottom portion of the trench. Even when the interior of the trench is washed in the case where the upper wire connected to the second electrode of the diode is formed, the second electrode layer is protected by the corrosion-suppressing layer and thereby is not corroded. This makes it possible to avoid a problem that non-uniformity of voltage-current characteristics among current steering elements occurs.

In the method of manufacturing the current steering element, in the step of forming the via hole, the via hole may be formed such that the corrosion-suppressing layer protrudes outward over an entire outer periphery of the lower opening of the via hole when viewed from a thickness direction of the interlayer insulating layer.

In the method of manufacturing the current steering element, in the step of forming the corrosion-suppressing layer, the corrosion-suppressing layer may be formed using a material having a standard electrode potential higher than a standard electrode potential of a material constituting the second electrode layer.

In the method of manufacturing the current steering element, in the step of forming the corrosion-suppressing layer, the corrosion-suppressing layer may be formed using a material having a standard electrode potential which is equal to or higher than 0.

In the method of manufacturing the current steering element, in the step of forming the corrosion-suppressing layer, the corrosion-suppressing layer may be formed using precious metal.

In the method of manufacturing the current steering element, in the step of forming the corrosion-suppressing layer, the corrosion-suppressing layer may be formed using a metal oxide having an electric conductivity.

In the method of manufacturing the current steering element, in the step of forming the first electrode layer, the first electrode layer may be formed using at least one material selected from a group consisting of tantalum nitride, titanium nitride, tungsten, and a metal oxide; in the step of forming the current steering layer, the current steering layer may be formed using silicon nitride; and in the step of forming the second electrode layer, the first electrode layer may be formed using at least one material selected from a group consisting of tantalum nitride, titanium nitride, tungsten, and a metal oxide.

A method of manufacturing a non-volatile memory element of the present invention comprises forming the current steering element by the above stated method of manufacturing the current steering element; and forming a bipolar variable resistance element which is connected in series with the current steering element and reversibly changes its resistance state between a higher-resistance state and a lower-resistance state by application of two electric pulses which are different in polarity.

According to another aspect of the present invention, there is provided a current steering element formed such that the current steering element covers a lower opening of a via hole formed in an interlayer insulating layer, comprising: a corrosion-suppressing layer formed on a lower side of a lower opening of the via hole such that the corrosion-suppressing layer covers an entire portion of the lower opening; a second electrode layer formed under the corrosion-suppressing layer and comprising a material different from a material of the corrosion-suppressing layer; a current steering layer formed under the second electrode layer such that the current steering layer is physically in contact with the second electrode layer; and a first electrode layer formed under the current steering layer such that the first electrode layer is physically in contact with the current steering layer; wherein the first electrode layer, the current steering layer and the second electrode layer constitute one of a MSM diode and a MIM diode; and wherein the first electrode layer and the lower wire are electrically connected to each other.

In this configuration, the second electrode layer (upper electrode layer) of the diode is protected by the corrosion-suppressing layer, and the second electrode layer is not exposed in a bottom portion of the via hole. Even when the interior of the via hole is washed in the case where a contact plug connected to the second electrode of the diode is formed, the second electrode layer is protected by the corrosion-suppressing layer and thereby is not corroded. This makes it possible to avoid a problem that non-uniformity of voltage-current characteristics among current steering elements occurs.

The term "lower opening" is defined as an opening located at a lower side, of two openings formed at upper and lower ends of the via hole. The term "lower side of the lower opening" is defined as a portion below this lower opening.

According to another aspect of the present invention, a current steering element comprises: a lower wire; a first electrode layer electrically connected to the lower wire; a current steering layer formed on the first electrode layer such that the current steering layer is physically in contact with the first electrode layer; a second electrode layer formed on the current steering layer such that the second electrode layer is physically in contact with the current steering layer; a corrosion-suppressing layer formed on the second electrode layer and comprising a material different from a material of the second electrode layer, and an upper wire filled inside a trench formed in an interlayer insulating layer such that the corrosion-suppressing layer is exposed in a lower opening of the trench; wherein the first electrode layer, the current steering layer, and the second electrode layer constitute one of a MSM diode and a MIM diode; and wherein the second electrode layer is electrically connected to the upper wire via the corrosion-suppressing layer; and wherein the second electrode layer and the upper wire are not physically in contact with each other.

In this configuration, the second electrode layer (upper electrode layer) of the diode is protected by the corrosion-suppressing layer, and the second electrode layer is not exposed in a bottom portion of the trench. Even when the interior of the trench is washed in the case where the upper wire connected to the second electrode of the diode is formed, the second electrode layer is protected by the corrosion-suppressing layer and thereby is not corroded. This makes it possible to avoid a problem that non-uniformity of voltage-current characteristics among current steering elements occurs.

In the current steering element, the corrosion-suppressing layer may protrude outward over an entire outer periphery of the lower opening of the via hole when viewed from a thickness direction of the interlayer insulating layer.

In the current steering element, a standard electrode potential of a material constituting the corrosion-suppressing layer may be higher than a standard electrode potential of a material constituting the second electrode layer.

In the current steering element, a standard electrode potential of a material constituting the corrosion-suppressing layer may be equal to or higher than 0.

In the current steering element, a material constituting the corrosion-suppressing layer may be precious metal.

In the current steering element, a material constituting the corrosion-suppressing layer may be a metal oxide having an electric conductivity.

In the current steering element, each of the first electrode and the second electrode may comprise at least one material selected from a group consisting of tantalum nitride, titanium nitride, tungsten, and a metal oxide.

In the current steering element, the current steering layer may comprise silicon nitride.

The current steering element may be electrically connected to the lower wire and thereby electrically charged.

A non-volatile memory element of the present invention comprises the above stated current steering element; and a bipolar variable resistance element which is connected in series with the current steering element and reversibly changes its resistance state between a higher-resistance state and a lower-resistance state by application of two electric pulses which are different in polarity.

According to another aspect of the present invention, a non-volatile memory device of the present invention comprises a memory array in which the non-volatile memory elements are arranged in matrix; a select circuit for selecting at least one non-volatile memory element from the memory array; and a write circuit which applies two electric pulses which are different in polarity to the non-volatile memory element selected by the select circuit to reversibly change a resistance state of the variable resistance element included in the non-volatile memory element between the higher-resistance state and the lower-resistance state.

The above and further objects, features and advantages of the invention will more fully be apparent from the following detailed description of preferred embodiments with reference to the accompanying drawings.

Advantageous Effects of the Invention

The present invention has the above described configuration, and a bidirectional current steering element (element having a good bidirectional current steering characteristic with respect to an applied voltage) which can be incorporated into a variable resistance non-volatile memory device, and a non-volatile memory element and a non-volatile memory device including the current steering element can suppress non-uniformity of voltage-current characteristics among current steering elements.

DESCRIPTION OF THE EMBODIMENTS

Hereinafter, embodiments of the present invention will be described with reference to the drawings.

Embodiment 1

[Configuration]

Figure 1A:
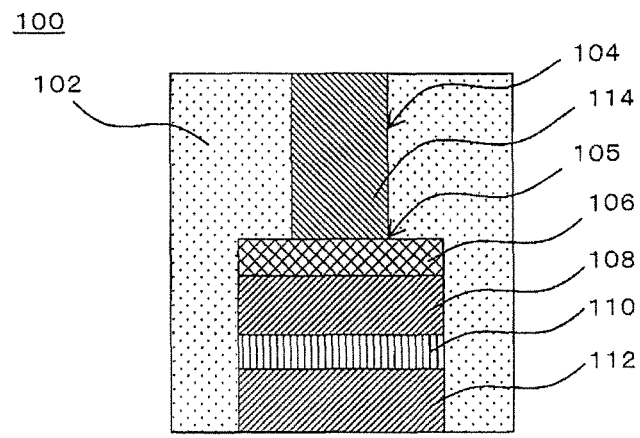
FIG. 1A is a cross-sectional view showing an exemplary schematic configuration of a current steering element according to Embodiment 1.
Figure 1B:
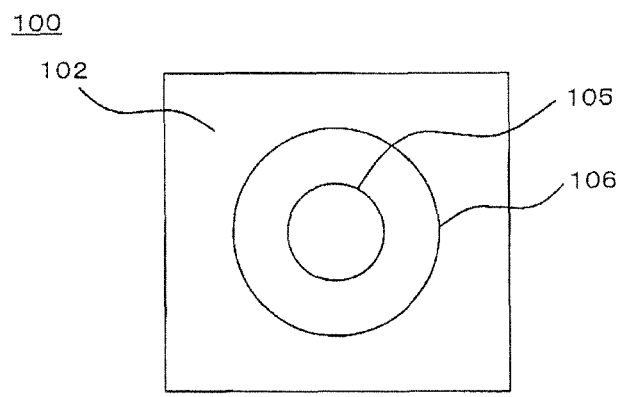
FIG. 1B is a plan view showing the exemplary schematic configuration of the current steering element according to Embodiment 1, when viewed from a thickness direction of an interlayer insulating layer.

FIG. 1 is a view showing an exemplary schematic configuration of a current steering element according to an embodiment of the present invention. FIG. 1A is a cross-sectional view and FIG. 1B is a plan view when viewed from a thickness direction of an interlayer insulating layer.

As shown in FIG. 1A, a current steering element 100 is a current steering element formed to cover a lower opening of a via hole 104 formed in an interlayer insulating layer 102. The current steering element 100 includes a corrosion-suppressing layer 106 formed such that it covers an entire portion of a lower opening 105 of the via hole 104, a second electrode layer 108 (in the present embodiment, upper electrode 108) formed under the corrosion-suppressing layer 106 and comprising a material different from a material of the corrosion-suppressing layer 106, a current steering layer 110 formed under the second electrode layer 108 such that the current steering layer 110 is physically in contact with the second electrode layer 108, and a first electrode layer 112 in the present embodiment (lower electrode 112) formed under the current steering layer 110 such that the first electrode layer 112 is physically in contact with the current steering layer 110. The first electrode layer 112, the current steering layer 110 and the second electrode layer 108 constitute one of a MSM diode and a MIM diode.

As shown in FIG. 1B, preferably, the corrosion-suppressing layer 106 is formed so as to protrude outward over an entire periphery of the lower opening 105 of the via hole 104 when viewed from a thickness direction of the interlayer insulating layer 102.

Preferably, a standard electrode potential (electric potential on the basis of a standard hydrogen electrode (0V)) of a material constituting the corrosion-suppressing layer 106 is higher than a standard electrode potential of a material constituting the second electrode layer 108. That is, preferably, the material constituting the corrosion-suppressing layer 106 is a material which is oxidized less easily than the material constituting the second electrode layer 108. Also, preferably, the material constituting the corrosion-suppressing layer 106 is a material which is higher in corrosion resistance than the material constituting the second electrode layer 108. Also, preferably, the standard electrode potential of the material constituting the corrosion-suppressing layer 106 is equal to or higher than 0V. The corrosion-suppressing layer 106 preferably comprises an electrically-conductive material, and more preferably comprises iridium (standard electrode potential: 1.16V). The material constituting the corrosion-suppressing layer 106 may be a precious metal, and may be a metal oxide (e.g., metal oxide such as $IrO_2$, $MoO_2$, $RuO_2$ and the like) having an electric conductivity and having a higher standard electrode potential than the material constituting the second electrode layer 108.

As a substrate, a silicon single-crystal substrate or a semiconductor substrate may be used. However, the substrate is not limited to these. Since the current steering element 100 can be formed at a relatively low substrate temperature, the current steering element 100 can be formed on a resin material, and the like.

A contact plug 114 is formed inside of the via hole 104.

The corrosion-suppressing layer 106 and the contact plug 114 filled inside of the via hole 104 are physically in contact with each other in the lower opening 105. The second electrode layer 108 may be connected to an upper wire (not shown) via, for example, the corrosion-suppressing layer 106 and the contact plug 114.

Each of the first electrode layer 112 and the second electrode layer 108 preferably comprises a material having a greater work function than the material constituting the current steering layer 110, while the material constituting the corrosion-suppressing layer may preferably comprise a precious metal. For example, when the current steering layer 110 comprises silicon nitride, each of the first electrode layer 112 and the second electrode layer 108 may comprise at least one material selected from a group consisting of tantalum nitride, titanium nitride, and tungsten. Each of the first electrode layer 112 and the second electrode layer 108 comprises a metal oxide having a greater work function than the material constituting the current steering layer 110.

For example, the current steering layer 110 comprises silicon nitride ($SiN_x$, $0<x\leq0.85$), the first electrode layer 112 comprises tantalum nitride (TaN, mole ratio between Ta and N is preferably Ta:N=1:1), and the second electrode layer 108 comprises tantalum nitride (TaN, mole ratio between Ta and N is preferably Ta:N=1:1, and standard electrode potential is preferably 0.48V).

In the above configuration, Schottky contact is formed between the first electrode layer 112 and the current steering layer 110, and Schottky contact is formed between the second electrode layer 108 and the current steering layer 110, thereby allowing the current steering layer 110 to function as the MSM diode. The MSM diode is a diode having in a bidirectional voltage polarity a non-linear voltage-current characteristic (ON/OFF characteristic) in which a resistance is higher when an absolute value of a voltage is smaller and becomes significantly lower when the absolute value of the voltage exceeds a predetermined value, and is able to flow a current bidirectionally.

The value of x of $SiN_x$ is a mole number of nitrogen atoms with respect to 1 mole of Si atoms, and represents a degree of nitriding (content ratio). An electric conductive property of $SiN_x$ is varied significantly depending on the value of x. Specifically, $SiN_x$ having a stoichiometric composition (x=1.33, i.e., $Si_3N_4$) is an insulator. When a ratio of nitrogen is made smaller than a ratio in the stoichiometric composition (i.e., the value of x is made smaller), $SiN_x$ changes gradually so as to exhibit a semiconductor property. The MSM diode has a structure in which a semiconductor is sandwiched between metal electrodes. The MSM diode can be formed by Schottky junction between metal and the semiconductor layer, and is expected as having a higher current supply capability than the MIM diode.

The MSM diode and the MIM diode do not employ characteristics such as crystal grain boundaries, unlike varistor which employs characteristics such as the crystal grain boundaries. Because of this, the MSM diode and the MIM diode are expected to be able to attain a current steering element which is less likely to be affected by a heat history, and the like during manufacturing process steps and is less in non-uniformity.

In the case where $SiN_x$ is used as the current steering layer 110 of the MSM diode, each of the first electrode layer 112 and the second electrode layer 108 which are in contact with the current steering layer 110 preferably comprises tantalum nitride which can attain a good Schottky interface with $SiN_x$. The tantalum nitride has a high compatibility with a Cu wire. In view of these, the present inventors intensively studied an electrode comprising tantalum nitride.

Figure 2:
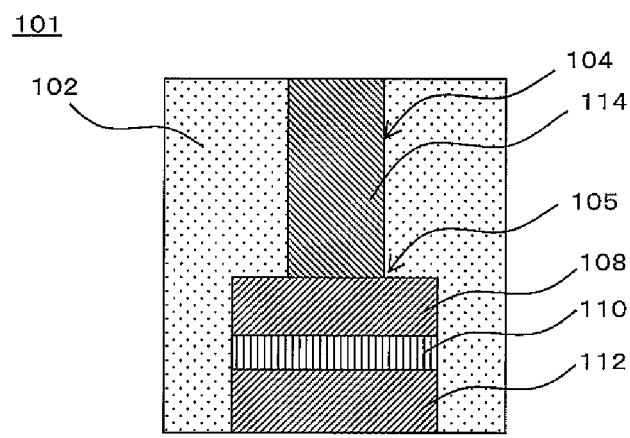
FIG. 2 is a schematic view showing an exemplary structure of a MSM diode element including a tantalum nitride electrode.
Figure 3:
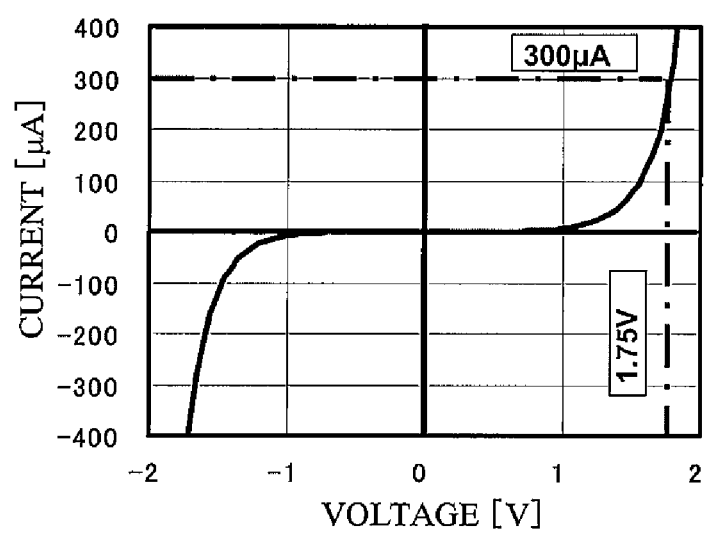
FIG. 3 is a view showing a voltage-current characteristic of the MSM diode element of FIG. 2.

FIG. 2 is a schematic view showing an exemplary structure of a MSM diode element 101 including the tantalum nitride electrode. FIG. 3 is a view showing a voltage-current characteristic of the MSM diode element of FIG. 2. In FIG. 2, regarding the MSM diode element 101, the same constituents as those of the first current steering element 100 of FIG. 1 are identified by the same reference symbols and names, and will not be described repetitively. The value of x in SiNx constituting the current steering layer 110 of the MSM diode element 101 was 0.3, a thickness of the current steering layer 110 was 10 nm, a size of a portion of the first electrode layer 112 and a portion of the current steering layer 110 which were in contact with each other was 0.5 µm×0.5 µm, and a size of a portion of the first electrode layer 112 and a portion of the second electrode layer 108 which were in contact with each other was 0.5 µm×0.5 µm. As shown in FIG. 3, a current value which was equal to or greater than 300 µA was ensured with respect to a voltage of 1.75V. The corresponding current density was 120000 A/cm². From the above results, it was discovered that a bidirectional MSM diode element having a great allowable current (current drivability) was attained by combining the electrode comprising tantalum nitride and the current steering layer comprising $SiN_x$.

[Manufacturing Method]

FIGS. 4, 5, and 6 are views each showing an exemplary manufacturing method of the current steering element according to Embodiment 1 of the present invention. Hereinafter, the manufacturing method of the current steering element according to the present embodiment will be described with reference to FIGS. 4, 5, and 6.

Figure 4A:
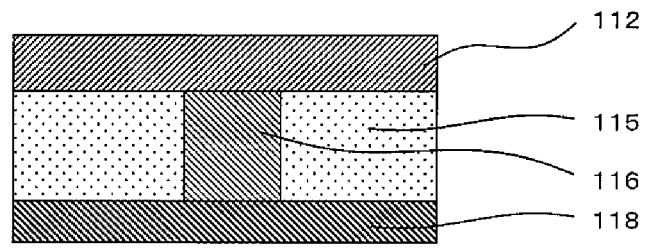
FIG. 4A is a view showing the step of forming a first electrode layer in an exemplary manufacturing method of the current steering element according to Embodiment 1.

Initially, as shown in FIG. 4A, the lower wire 118 is formed on the substrate (not shown) comprising, for example, the single-crystal silicon, the interlayer insulating layer 115 comprising, for example, $SiO_2$ and having a thickness of 200 nm is formed by thermal oxidation such that the interlayer insulating layer 115 covers the lower wire 118, the contact plug 116 is formed such that it penetrates the interlayer insulating layer 115 and reaches the lower wire 118, and the first electrode layer 112 comprising, for example, TaN and having a thickness of 100 nm is deposited by sputtering of a Ta target under a mixture-gas atmosphere of argon and nitrogen such that the first electrode layer 112 covers an upper end surface of the contact plug 116 (step of forming the first electrode layer).

Figure 4B:
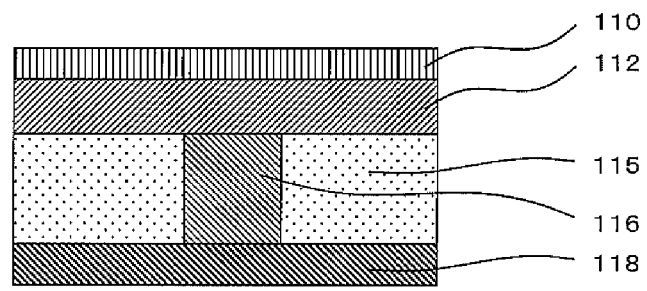
FIG. 4B is a view showing the step of forming a current steering layer on the first electrode layer such that the current steering layer physically contacts the first electrode layer, in the exemplary manufacturing method of the current steering element according to Embodiment 1.

Then, as shown in FIG. 4B, the current steering layer 110 comprising, for example, $SiN_x$ and having a thickness of 10 nm is formed on the first electrode layer 112 such that the current steering layer 110 physically contacts the first electrode layer 112 by sputtering of a polycrystal silicon target under a mixture-gas atmosphere of argon and nitrogen (step of forming the current steering layer on the first electrode layer such that the current steering layer physically contacts the first electrode layer). The value of x in $SiN_x$ may be varied by modifying sputtering conditions (gas flow ratio between argon and nitrogen, and the like).

Figure 4C:
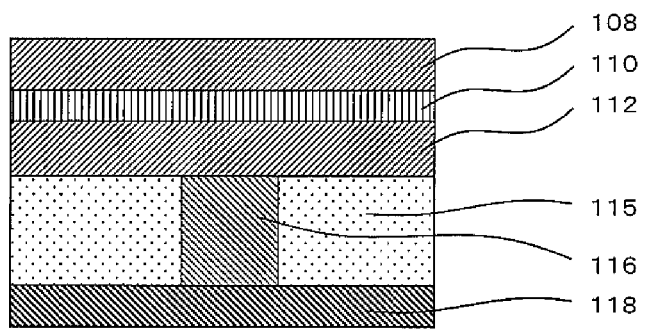
FIG. 4C is a view showing the step of forming a second electrode layer on the current steering layer such that the second electrode layer physically contacts the current steering layer, in the exemplary manufacturing method of the current steering element according to Embodiment 1.

Then, as shown in FIG. 4C, the second electrode layer 108 comprising, for example, TaN and having a thickness of 50 nm is formed on the current steering layer 110 such that the second electrode layer 108 physically contacts the current steering layer 110 by sputtering of a Ta target under a mixture-gas atmosphere of argon and nitrogen (step of forming the second electrode layer on the current steering layer such that the second electrode layer physically contacts the current steering layer).

Figure 5A:
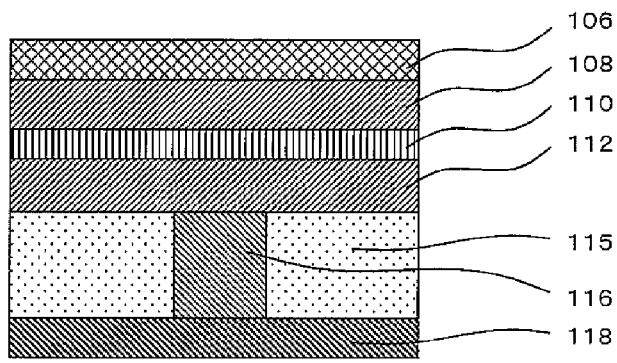
FIG. 5A is a view showing the step of forming on the second electrode layer a corrosion-suppressing layer using a material different from a material of the second electrode layer, in the exemplary manufacturing method of the current steering element according to Embodiment 1.

Then, as shown in FIG. 5A, the corrosion-suppressing layer 106 comprising a material (e.g., iridium) different from a material of the second electrode layer 108 is formed on the second electrode layer 108 by, for example, sputtering (step of forming on the second electrode layer the corrosion-suppressing layer comprising a material different from a material of the second electrode layer). The forming methods of the first electrode layer 112, the current steering layer 110, the second electrode layer 108 and the corrosion-suppressing layer 106 are not particularly limited, and may not be the sputtering.

Figure 5B:
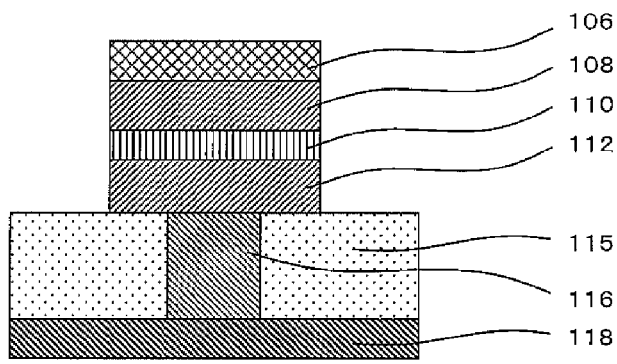
FIG. 5B is a view showing the step of patterning the first electrode layer, the current steering layer, the second electrode layer, and the corrosion-suppressing layer in the exemplary manufacturing method of the current steering element according to Embodiment 1.

Then, as shown in FIG. 5B, the first electrode layer 112, the current steering layer 110, the second electrode layer 108 and the corrosion-suppressing layer 106 are patterned (step of patterning the first electrode layer, the current steering layer, the second electrode layer and the corrosion-suppressing layer).

Figure 5C:
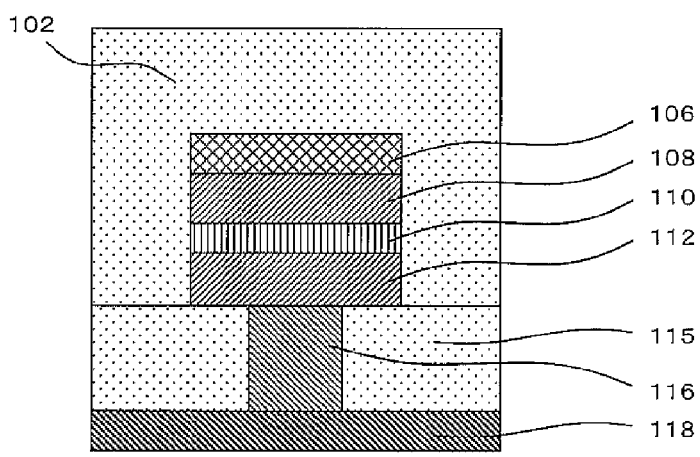
FIG. 5C is a view showing the step of forming an interlayer insulating layer such that the interlayer insulating layer covers the corrosion-suppressing layer in the exemplary manufacturing method of the current steering element according to Embodiment 1.

Then, as shown in FIG. 5C, the interlayer insulating layer 102 comprising, for example, $SiO_2$ and a final thickness of 200 nm on the corrosion-suppressing layer 106 is formed to cover the corrosion-suppressing layer 106, the second electrode layer 108, the current steering layer 110 and the first electrode layer 112 (step of forming the interlayer insulating layer such that the interlayer insulating layer covers the corrosion-suppressing layer).

Figure 6A:
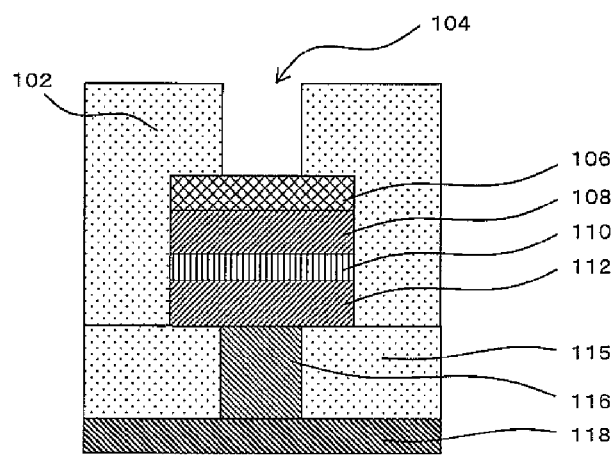
FIG. 6A is a view showing the step of forming a via hole in the interlayer insulating layer such that an entire portion of the lower opening of the via hole is covered with the corrosion-suppressing layer in the exemplary manufacturing method of the current steering element according to Embodiment 1.

Then, as shown in FIG. 6A, the via hole 104 is formed in the interlayer insulating layer 102 such that the corrosion-suppressing layer 106 covers an entire portion of the lower opening of the via hole 104 (step of forming the via hole in the interlayer insulating layer such that an entire portion of the lower opening of the via hole opens on the corrosion-suppressing layer).

Figure 6B:
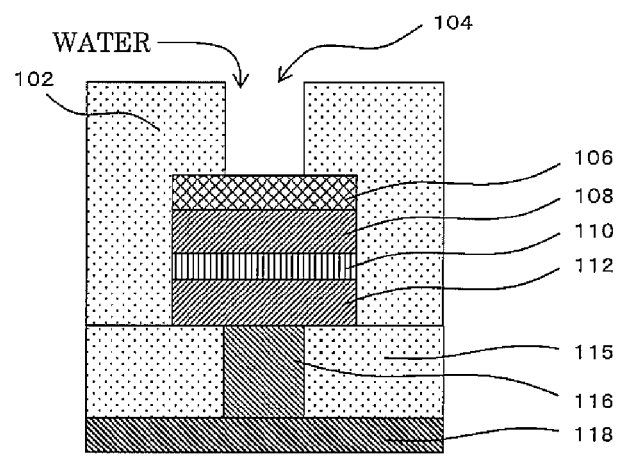
FIG. 6B is a view showing the step of washing an interior of the via hole with a washing liquid containing water in the exemplary manufacturing method of the current steering element according to Embodiment 1.

Then, as shown in FIG. 6B, an interior of the via hole 104 is washed using a solvent (washing liquid) containing water (step of washing an interior of the via hole using a solvent containing water).

Figure 6C:
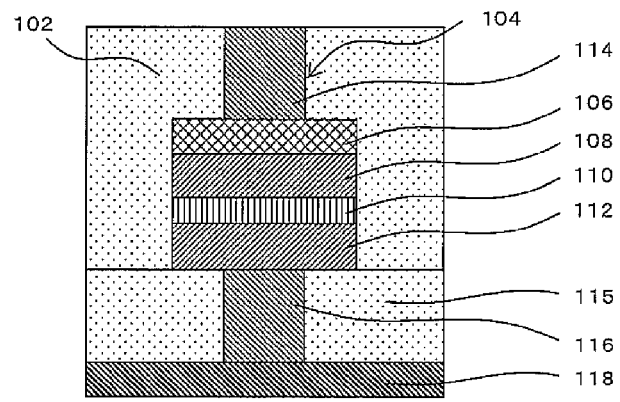
FIG. 6C is a view showing the step of forming a contact plug inside of the via hole in the exemplary manufacturing method of the current steering element according to Embodiment 1.

Then, as shown in FIG. 6C, the contact plug 114 is formed inside of the via hole 104 (step of forming the contact plug inside of the via hole). Specifically, for example, Ti of 10 nm as an adhesive layer, and TiN of 10 nm as a barrier layer for W which is a major material of the wire are sequentially deposited by the CVD into the via hole 104, and then tungsten is filled into the via hole 104 by the CVD. Instead of tungsten, for example, copper may be used. In that case, the barrier layer (e.g., Ta or TaN) for copper is formed firstly.

In the step of FIG. 5B (step of patterning the first electrode layer 112, the current steering layer 110, the second electrode layer 108 and the corrosion-suppressing layer 106), it is not essential that they be patterned together (using the same mask). For example, the first electrode layer 112, the current steering layer 110, the second electrode layer 108 and the corrosion-suppressing layer 106 may be individually patterned when they are respectively formed. In this case, the first electrode layer 112, the current steering layer 110, the second electrode layer 108 and the corrosion-suppressing layer 106 are not patterned together, and therefore step of FIG. 5B can be omitted.

A constituent formed inside of the via hole 104 in the step of FIG. 6C is not necessarily the contact plug 114 filled inside of the via hole and planarized, but a normal via (a portion of a wire is connected to a lower-layer wire inside of the via hole) may be formed.

EXPERIMENT EXAMPLE 1

In experiment example 1, a plurality of current steering elements were created for two kinds of configurations (wiring pattern 1, wiring pattern 2) which were different from each other in area of wire (floating wire, ungrounded lower wire) connected to the lower electrode, and their voltage-current characteristics were researched.

Initially, aluminum was deposited on the Si substrate and the lower wire 118 was formed by patterning. In the wiring pattern 1, the area of the lower wire 118 was set to about 69 $\mu m^2$. In the wiring pattern 2, the area of the lower wire 118 was set to about 6700 $\mu m^2$.

On the substrate provided with the lower wire 118, the interlayer insulating layer 115 (final thickness on the lower wire: 200 nm) comprising $SiO_2$ was formed. Thereafter, a lower via hole of a diameter 0.26 µm was formed by using a mask and by dry etching such that the wire was exposed in a bottom portion thereof, and a residual of a polymer remaining after the dry etching was removed using a weak hydrofluoric washing liquid. In a state in which the lower via hole was formed (for the purpose of removing contaminants), an obverse surface and a reverse surface of a wafer were subjected to spin washing using pure water. Thereafter, titanium (Ti) and titanium nitride (TiN) were deposited in this order into the lower via hole, and then tungsten (W) was filled into the lower via hole, thereby forming the lower contact plug 116.

An upper end surface of the interlayer insulating layer 115 and an upper end surface of the lower contact plug 116 were planarized to be coplanar with each other and exposed by CMP. Then, titanium nitride (TiN, thickness: 20 nm), tantalum nitride (TaN, mole ratio between Ta and N was Ta:N=1:1, thickness: 10 nm, first electrode layer 112), silicon nitride ($SiN_x$, mole ratio between Si and N was Si:N=1:0.3, thickness 10 nm, current steering layer 110), and tantalum nitride (TaN, mole ratio between Ta and N was Ta:N=1:1, thickness: 50 nm, second electrode layer 108) were deposited in this order. These deposited layers were patterned to have a square shape of 0.5 µm×0.5 µm such that they overlap with the lower contact plug 116, thereby forming the current steering element (MSM diode).

Furthermore, the interlayer insulating layer 102 (thickness of 600 nm) comprising $SiO_2$ was formed to cover the current steering element. Then, the upper via hole 104 of a diameter 0.26 µm was formed by using a mask and by dry etching such that the second electrode layer 108 of the current steering element was exposed in a bottom portion thereof, and a residual of a polymer remaining after the dry etching was removed using a weak hydrofluoric washing liquid. In a state in which the via hole 104 was formed on the upper electrode 108 of the current steering element (for the purpose of removing contaminants), an obverse surface and a reverse surface of a wafer were subjected to spin washing using water. Then, titanium (Ti) and titanium nitride (TiN) were deposited in this order into the via hole 104, and then tungsten (W) was filled into the via hole 104, thereby forming the contact plug 114. Finally, aluminum was deposited and patterned, thereby forming the upper wire.

In the above described method, for each of the wiring pattern 1 and the wiring pattern 2, 44 current steering elements were formed on one piece of wafer, and voltage-current characteristics were measured for the respective elements. For the wiring pattern 1, a current was changed like, $10^{-8}$ A, $10^{-7}$ A, $5×10^{-7}$ A, $10^{-6}$ A, $5×10^{-6}$ A, $10^{-5}$ A, $2×10^{-5}$ A, $5×10^{-5}$ A, and $10^{-4}$ A, and a voltage between the lower (first) electrode 112 and the upper (second) electrode 108 was measured. Regarding the wiring pattern 2, voltages corresponding to the same current were significantly non-uniform among the 44 elements. A current between the lower electrode and the upper electrode was measured in a state in which the voltage was changed like 0.25V, 0.5V, 0.75V, 1V, 1.25V, 1.5V, 1.75V, and 2V.

Figure 7A:
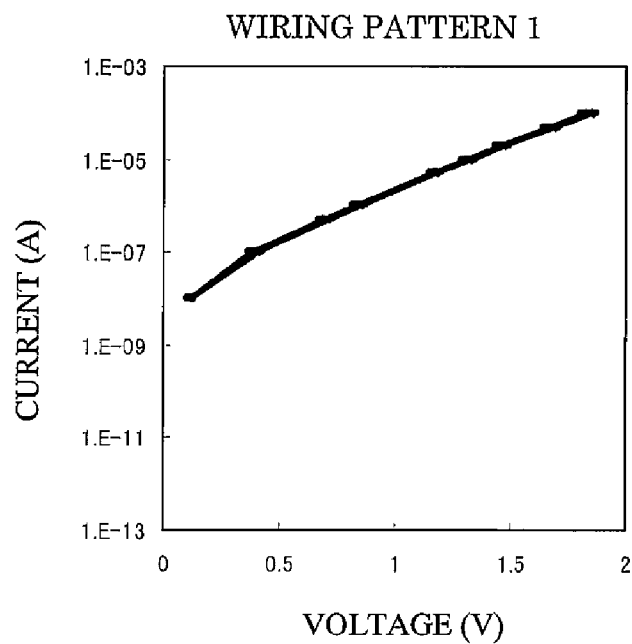
FIG. 7A is a view showing a voltage-current characteristic in a wiring pattern 1 which is measured in Experiment example 1.
Figure 7B:
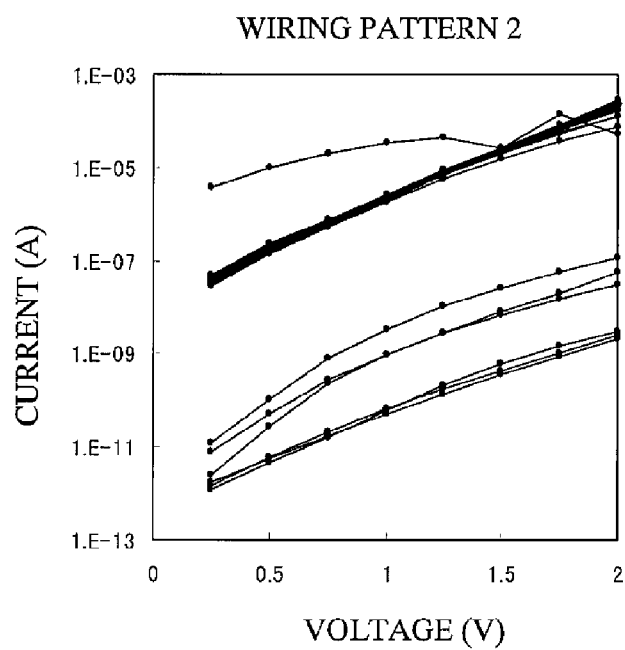
FIG. 7B is a view showing a voltage-current characteristic in a wiring pattern 2 which is measured in Experiment example 1.

FIGS. 7A and 7B are views showing the voltage-current characteristics created and measured in Experiment example 1. FIG. 7A is a view showing the voltage-current characteristics in the wiring pattern 1. FIG. 7B is a view showing the voltage-current characteristics in the wiring pattern 2.

As can be seen from FIGS. 7A and 7B, the voltage-current characteristics corresponding to the wiring pattern 1 were substantially uniform, whereas the voltage-current characteristics corresponding to the wiring pattern 2 were significantly non-uniform among the 44 elements. In addition, elements (elements having a low current drivability) in which a current did not flow substantially, for example, the current was $10^{-9}$ A or less even when the voltage was increased up to 2V, were observed.

In order to study a cause of the significant non-uniformity of the voltage-current characteristics, corresponding to the wiring pattern 2, the cross-section of the element was observed using a scanning electron microscope.

Figure 8A:
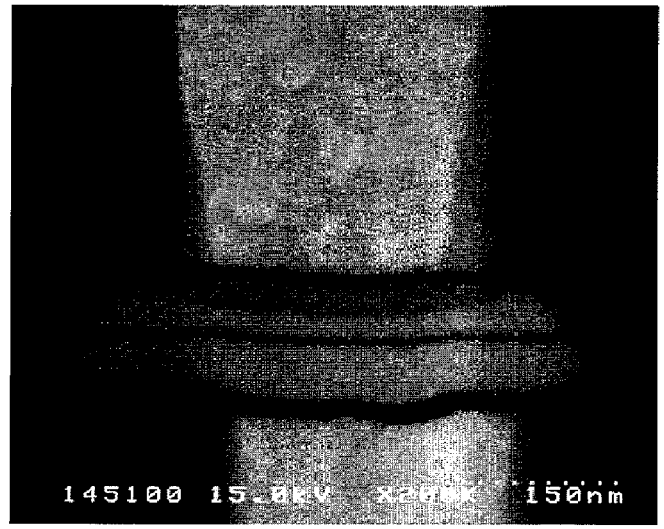
FIG. 8A is a scanning electron microscope photograph showing a result of observation of a cross-section of a current steering element in the wiring pattern 2 in Experiment example 1.
Figure 8B:
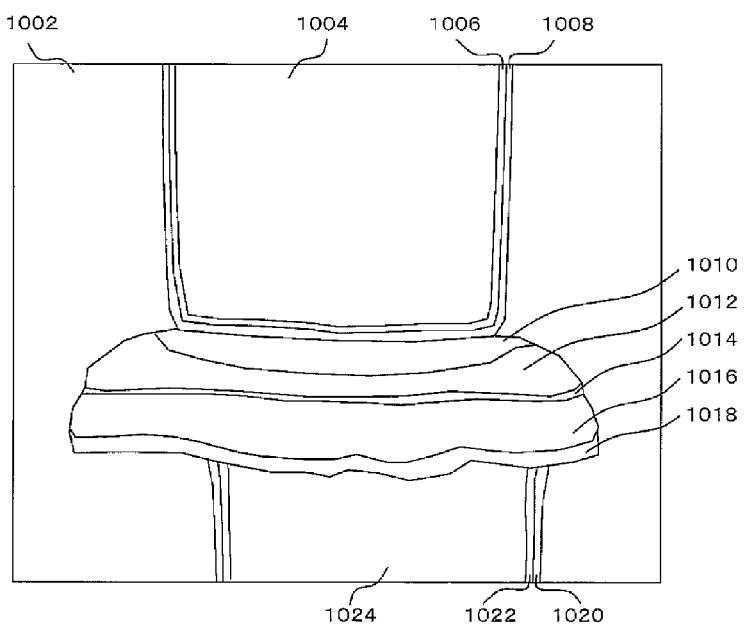
FIG. 8B is a view of a trace of FIG. 8A.

FIG. 8 shows results of observation of the cross-section of the current steering element of the wiring pattern 2 in Experiment example 1. FIG. 8A is a scanning electron microscope photograph and FIG. 8B is a view of a trace of FIG. 8A.

In the example of FIG. 8, 1002 designates an interlayer insulating layer ($SiO_2$), 1004 designates a tungsten region (W), 1006 designates a barrier layer (TiN), 1008 designates an adhesive layer (Ti), 1010 designates a discolored portion of the upper electrode (TaN), 1012 designates a non-discolored portion of the upper electrode (TaN), 1014 designates a current steering layer ($SiN_x$), 1016 designates a lower electrode (TaN), 1018 designates a barrier layer (TiN), 1020 designates an adhesion layer (Ti), 1022 designates a barrier layer (TiN), and 1024 designates a tungsten region (W).

As shown in FIG. 8, in the current steering element of the wiring pattern 2, a portion of the upper electrode 108 (TaN) was discolored in the vicinity of the upper via hole, and it was presumed that TaN was altered. It was presumed that because of this alternation (property change), non-uniformity of resistance values of the upper electrode 108, and the like occurred, and thereby significant non-uniformity of the voltage-current characteristics occurred.

EXPERIMENT EXAMPLE 2

In Experiment example 2, in order to study a cause of the alternation (property change) occurring in the upper electrode in Experiment example 1, the cross-section of the element was measured using a Scanning Auger Microprobe (SAM). In Experiment example 2, measurement was made for the sample which was extremely degraded in voltage-current characteristic (voltage-current characteristic which was difficult to measure), among samples having a configuration similar to that of the wiring pattern 2 in Experiment example 1 and created by the manufacturing method similar to that in Experiment example 1. This was probably because the degree of alternation of the upper electrodes 108 was considered to be greater in the sample which was extremely degraded in voltage-current characteristic.

Figure 9A:
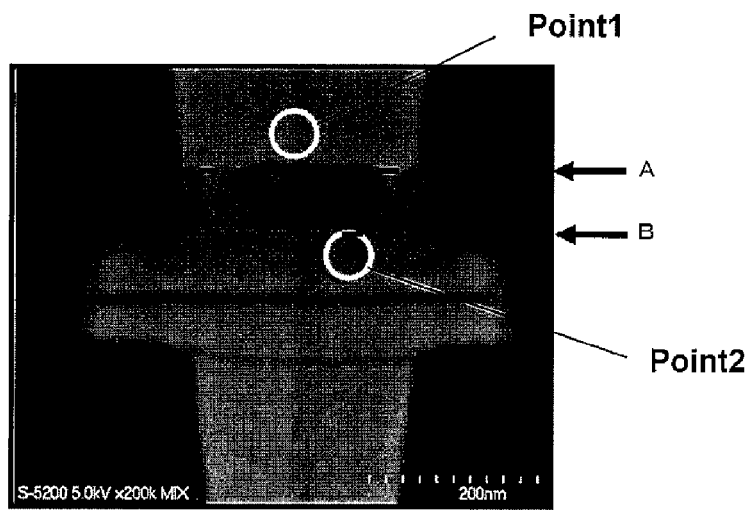
FIG. 9A is a scanning electron microscope photograph showing a result of observation of a cross-section of a current steering element in Experiment example 2.
Figure 9B:
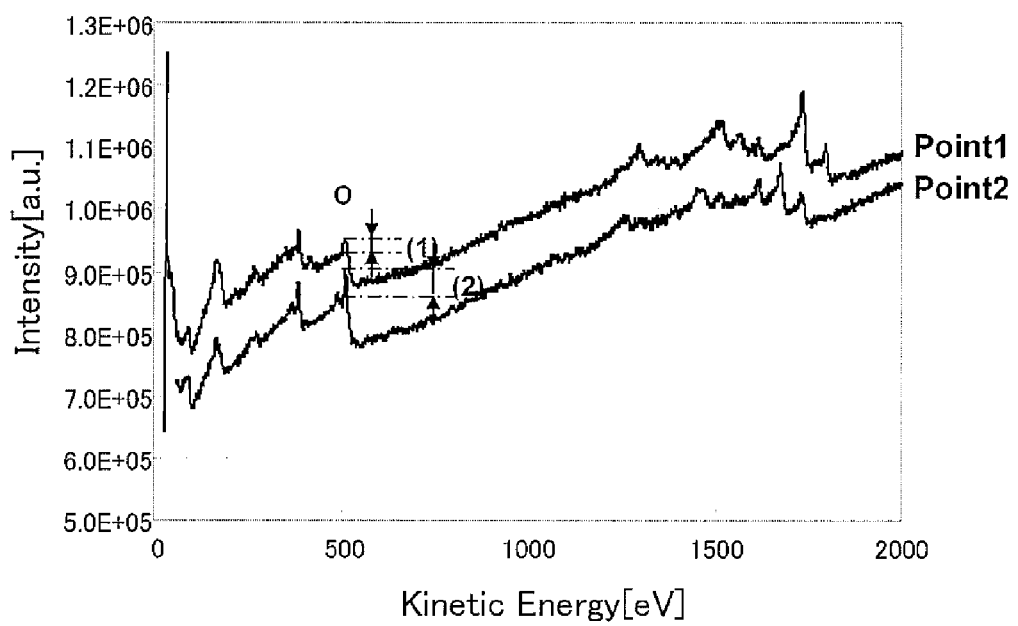
FIG. 9B shows spectra at Point 1 and at Point 2 in FIG. 9A, which are measured by a Scanning Auger Microprobe.

FIG. 9 is a view showing results of observation of the current steering element in Experiment example 2. FIG. 9A shows a scanning electron microscope photograph of the cross-section. FIG. 9B shows spectra at Point 1 and at Point 2 in FIG. 9A, which are measured by the Scanning Auger Microprobe(SAM). In FIG. 9B, a horizontal axis indicates a kinetic energy of Auger electrons emitted, and a vertical axis indicates a relative intensity.

As can be seen from FIG. 9A, in the sample measured in Experiment example 2, the degree of alternation of the upper electrode was greater and a portion of the upper end surface of the upper electrode 108 which should be located at a position of B in FIG. 9A swelled up to a position of A in FIG. 9A. The discolored portion 1010 of the upper electrode 108 extended outward farther than the bottom surface of the via hole 104. Such alternation was attributed to washing of the via hole carried out after the via hole 104 was formed, rather than the dry etching during formation of the via hole 104.

As can be seen from FIG. 9B, a peak (2) of oxygen of a spectrum measured at Point 2 which was the discolored portion 1010 of the upper electrode 108 was greater than a peak (1) of oxygen of a spectrum measured at Point 1 which was a region (contact plug) which was substantially free from oxygen. From this, it was estimated that the alternation which was the discolored portion 1010 of the upper electrode 108 was caused by oxidation.

It is known that a passive state of an oxide coating layer formed on a surface of Ta allows Ta to improve a corrosion resistance. However, an oxide layer of TaN or a Ta oxide coating becomes a higher-resistance state in formation of a contact and therefore must be removed. It was predicted that Ta which was not provided with the oxide coating layer was more likely to be corroded and the Ta oxide was formed in a water-washing process when the interior of the via hole 104 was washed.

In manufacturing of the current steering element, at a time point when the upper via hole 104 was washed, the upper electrode 108 was electrically connected to the lower wire 118 via the lower electrode 112 and the lower contact plug 116. In Experiment example 2 and the wiring pattern 2 of Experiment example 1, the area of the lower wire 118 was greater, and the lower wire 18 was easily electrically charged. Charges accumulated in the lower wire 118 flowed to the upper electrode 108, which was electrically charged. In addition, it was predicted that, to wash the interior of the upper via hole 104 using the washing liquid, the electric charging, the water and the oxygen act in a compositive manner, to cause a localized electrical cell to be generated on a metal surface, thereby causing the upper electrode 108 to be oxidized, and as a result, alternation proceeded.

A total reaction formula of Ta oxidation is expressed as:

$$2Ta + 5H_2O + 5/2O_2 \rightarrow 2Ta(OH)_5$$

Chemical reaction formulas are expressed as:

$$2Ta \rightarrow 2Ta^{5+} + 10e^- \qquad \text{(anode reaction)}$$

$$5/2O_2 + 5H_2O + 10e^- \rightarrow 10(OH)^- \qquad \text{(cathode reaction)}$$

Oxidized Ta and oxidized TaN form $2Ta(OH)_5$ and TaON, respectively, causing the electric resistance in the upper electrode 108 of the current steering element to increase. As a result, non-uniformity of the voltage-current characteristics occurs.

In manufacturing process steps of a practiced device, at a time when the upper via hole 104 is washed, the size of the area of the lower wire 118 electrically connected to the element is increased, and the lower wire 118 is easily electrically charged, which often happens. The fact that the alternation of the upper electrode 108 of the current steering element occurs easily due to the increase in the area of the lower wire 118 and thereby a degree of non-uniformity of the voltage-current characteristics increases may lead to a severe problem in the manufacturing process steps of the practiced device. To solve such a problem, it becomes necessary to suppress the alternation of the upper electrode 108 caused by the oxidation.

The wiring pattern 2 of Experiment example 1 and the wiring pattern 2 of Experiment example 2 had a large-sized pad as the lower wire 118. Similar problem may arise in a case where a long wire is floating wire (ungrounded wire), instead of the pad.

In view of the above, the present inventors conceived that the problem could be solved by placing a material which was less easily oxidized as the corrosion-suppressing layer 106 on the upper electrode 108 to protect the upper electrode 108.

Typically, the standard electrode potential indicates a degree with which the corresponding material is oxidized easily. When a value of the standard electrode potential is greater, the corresponding material is oxidized less easily, while when the value of the standard electrode potential is smaller, the corresponding material is oxidized more easily. A standard electrode potential of Ta is −0.6(V) which is lower than an electrode potential of hydrogen. Therefore, it was presumed that Ta was easily oxidized.

As a material of the corrosion-suppressing layer 106, a material which has an electric conductivity and is oxidized less easily is suitably used. Specifically, a material having a higher redox potential (standard electrode potential) than the material of the upper electrode 108 is preferably used. For example, a material having a standard electrode potential of 0 or greater and precious metal (platinum, palladium, iridium, and the like) are suitably used.

As the material of the corrosion-suppressing layer 106, a material which has already been oxidized and thereby is oxidized less easily may be used. For example, metal oxides such as $IrO_2$, $MoO_2$, $RuO_2$, and the like having an electric conductivity, and a compound containing precious metal may be used.

Hereinafter, a description will be given of a result of study about a difference in non-uniformity of the voltage-current characteristics which depends on presence/absence of the corrosion-suppressing layer 106, as Experiment example 3.

EXPERIMENT EXAMPLE 3

In the current steering element in Experiment example 3, the lower wire 118 was configured to have a wiring pattern similar to the wiring pattern 2 in Experiment example 1. A manufacturing method of the current steering element in Experiment example 3 was identical to that of Experiment example 1 except that after a tantalum nitride layer which would become the upper electrode 108 was deposited, a layer of iridium (Ir) which would become the corrosion-suppressing layer 106 was deposited before patterning of the current steering element. A configuration of the current steering element in Experiment example 3 was identical to that of Experiment example 1 except that the corrosion-suppressing layer 106 comprising iridium was provided on the upper electrode 108. A thickness of the corrosion-suppressing layer 106 was 30 nm.

In Experiment example 3, 44 current steering elements were formed on one piece of wafer, and voltage-current characteristics was measured for each of these elements.

Figure 10A:
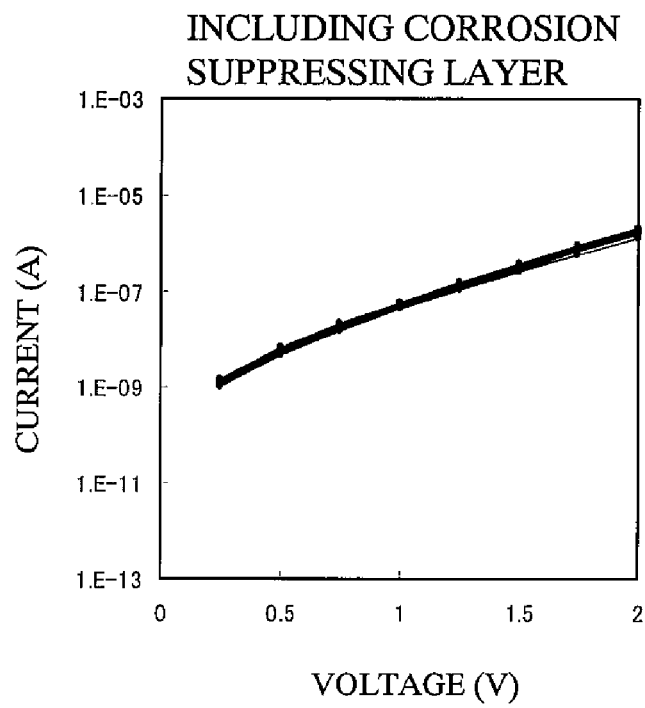
FIG. 10A is a view showing a voltage-current characteristic of a current steering element provided with the corrosion-suppressing layer which is measured in Experiment example 3.
Figure 10B:
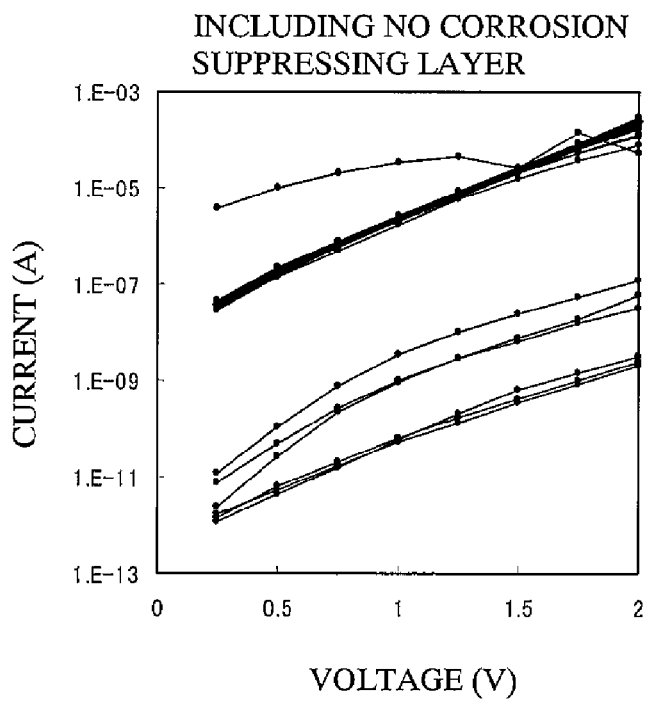
FIG. 10B is a view showing a voltage-current characteristic of a current steering element which is not provided with the corrosion-suppressing layer which is measured in Experiment example 3.

FIG. 10 is a view showing the voltage-current characteristics measured in Experiment example 3. FIG. 10A is a view showing voltage-current characteristics of the current steering element provided with the corrosion-suppressing layer 106. FIG. 10B is a view showing voltage-current characteristics of the current steering element which is not provided with the corrosion-suppressing layer. FIG. 10B is the same as FIG. 7B.

As shown in FIG. 10A, by providing the corrosion-suppressing layer 106, non-uniformity of the voltage-current characteristics of the current steering elements was drastically lessened.

Figure 11A:
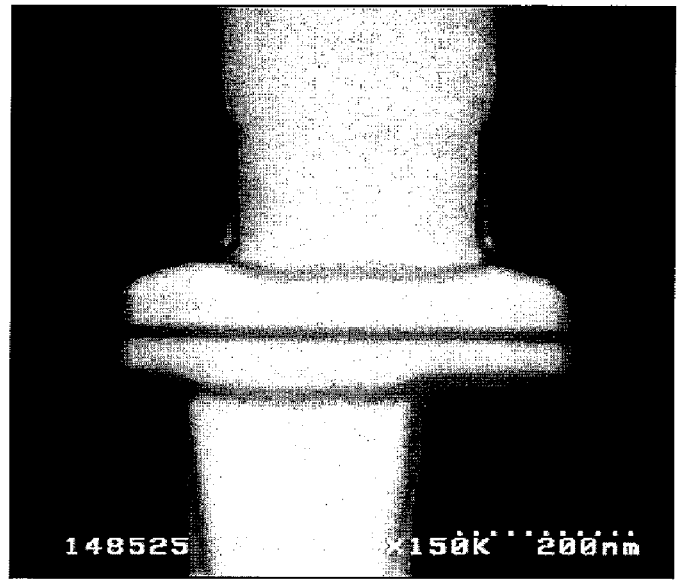
FIG. 11A is a scanning electron microscope photograph showing a result of observation of a cross-section of the current steering element in Experiment example 3.
Figure 11B:
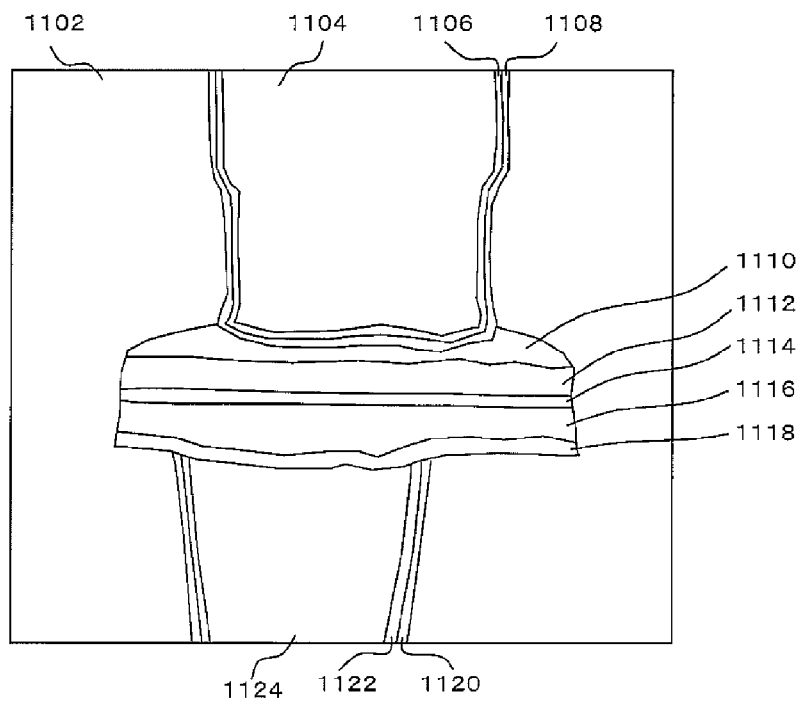
FIG. 11B is a trace of FIG. 11A.

FIG. 11 shows results of observation of the cross-section of the current steering element in Experiment example 3. FIG. 11A is a scanning electron microscope photograph and FIG. 11B is a view of a trace of FIG. 11A.

In the example of FIG. 11, 1102 designates an interlayer insulating layer ($SiO_2$), 1104 designates a tungsten region (W), 1106 designates a barrier layer (TiN), 1108 designates an adhesive layer (Ti), 1110 designates a corrosion-suppressing layer (Ir), 1112 designates an upper electrode (TaN), 1114 designates a current steering layer ($SiN_x$), 1116 designates a lower electrode (TaN), 1118 designates a barrier layer (TiN), 1120 designates an adhesive layer (Ti), 1122 designates a barrier layer (TiN), and 1124 designates a tungsten region (W).

As shown in FIG. 11, in the element in Experiment example 3, the discolored portion of FIG. 6 was not present in the upper electrode 108. From this, it was confirmed that in Experiment example 3, the alternation of the upper electrode 108 was suppressed. The corrosion-suppressing layer 106 (Ir) was exposed in a bottom portion of the upper via hole 104. The via hole 104 did not reach an upper surface of the upper electrode 108 (TaN). That is, when the interior of the upper via hole 104 was washed, the upper electrode 108 was protected by the corrosion-suppressing layer 106. It was presumed that the alternation of the upper electrode 108 due to oxidation was suppressed because of the protection.

EXPERIMENT EXAMPLE 4

Next, current steering characteristics in a case where the value of x in $SiN_x$ constituting the current steering layer 110 in the configuration similar to that in Experiment example 3 was changed were studied. The thickness of the current steering layer 110 ($SiN_x$ layer) was 10 nm, and the values of x were 0.3, 0.45, and 0.6.

Figure 12:
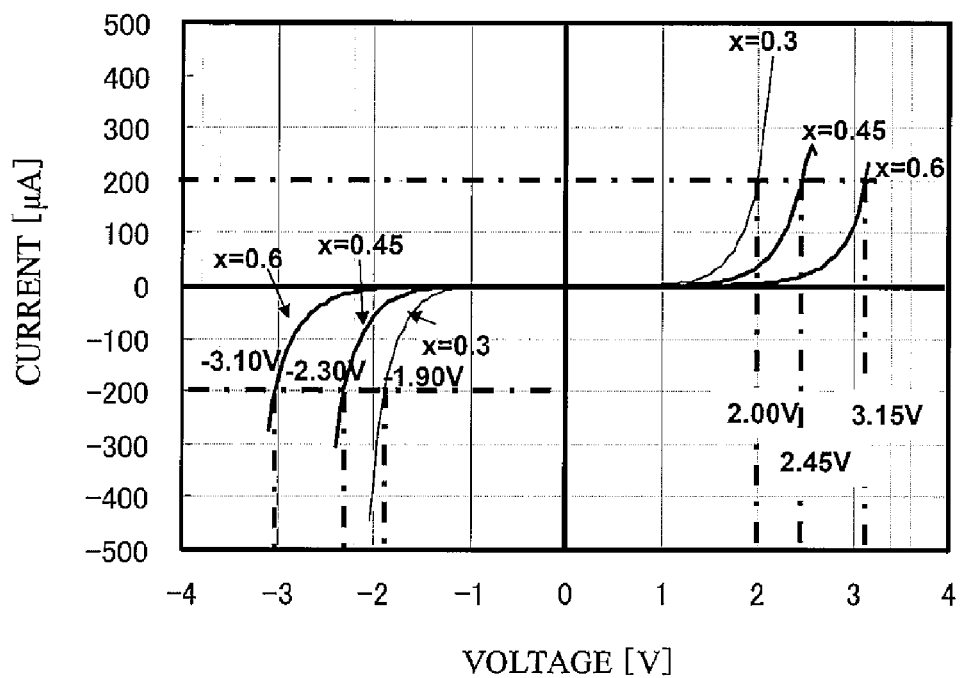
FIG. 12 is a view showing a voltage-current characteristic measured in Experiment example 4.

FIG. 12 is a view showing voltage-current characteristics measured in Experiment example 4.

In a state in which a current value of the element was 200 μA (current density: 80000 A/cm$^2$), the voltage was 2V, when the value of x in $SiN_x$ was 0.3, the voltage was 2.45V when the value of x in $SiN_x$ was 0.45, and the voltage was 3.15V when the value of x in $SiN_x$ was 0.6. Thus, in these values, good bidirectional diode characteristics (having non-linear ON/OFF characteristics in both voltage polarities) were attained.

MODIFIED EXAMPLE

Figure 13A:
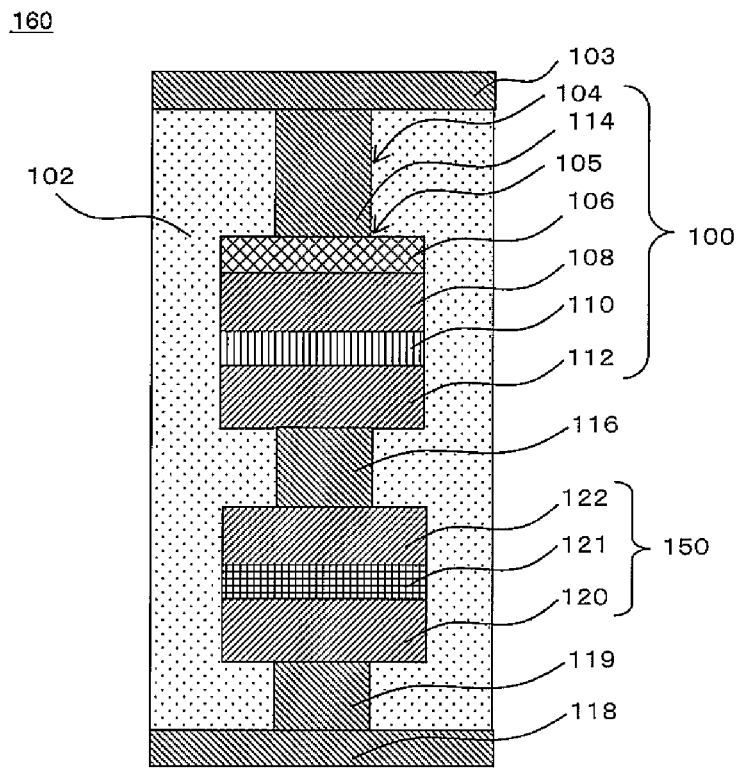
FIG. 13A is a cross-sectional view showing an exemplary schematic configuration of a non-volatile memory element according to a Modified example of Embodiment 1.
Figure 13B:
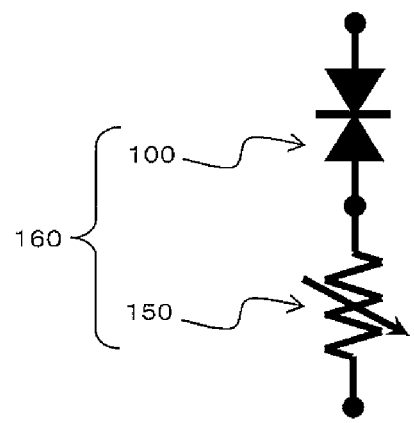
FIG. 13B is an equivalent circuit diagram of FIG. 13A.
Figure 14:
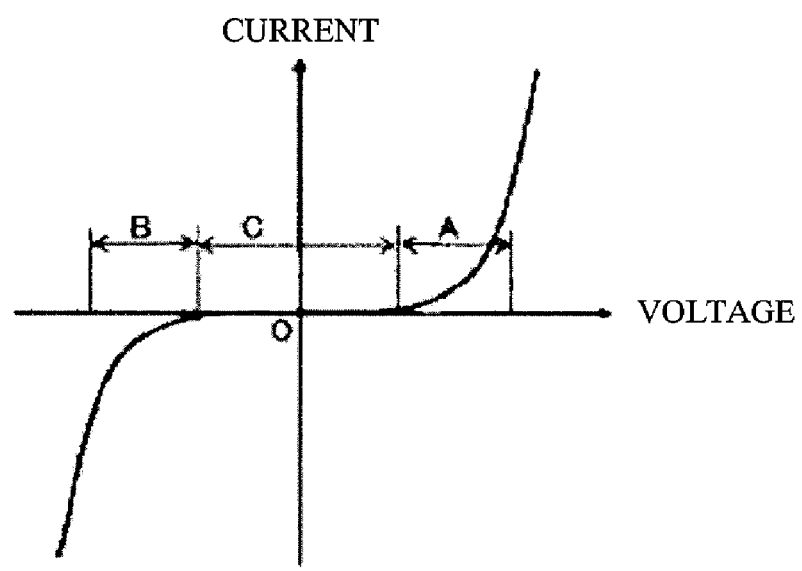
FIG. 14 is view showing a voltage-current characteristic of a general bidirectional diode.

FIG. 13 is a view showing an exemplary schematic configuration of a non-volatile memory element according to Modified example of Embodiment 1 of the present invention. FIG. 13A is a cross-sectional view. FIG. 13B is an equivalent circuit diagram.

As shown in FIG. 13, by combining the current steering element of the present embodiment with a bipolar variable resistance element 150 (comprising e.g., a lower electrode 120, a variable resistance layer 121, and an upper electrode 122) which reversibly changes its resistance state between a higher-resistance state and a lower-resistance state by application of electric pulses which are different in polarity, i.e., by utilizing the current steering element of the present embodiment, as a bidirectional current steering element, it becomes possible to implement a cross-point non-volatile memory element 160 including the bipolar variable resistance element 150.

The first electrode layer 112 of the current steering element is connected to the upper electrode 122 of the variable resistance element 150 via the contact plug 116. The lower electrode 120 of the variable resistance element 150 is connected to the lower wire 118 via a contact plug 119. The lower wire 118 may be, for example, a word line, while the upper wire 103 may be, for example, a bit line.

The bipolar non-volatile memory element 160 is configured to control change its resistance state using two threshold voltages which are different in polarity. The voltage-current characteristic of the current steering element formed in the present embodiment can be adjusted by changing a composition (concentration of nitrogen) of $SiN_x$ (changing an electric potential barrier formed between the electrode and the semiconductor layer). Therefore, it becomes possible to easily implement the voltage-current characteristic (setting of ON/OFF range) adapted to the variable resistance element.

The variable resistance element 150 has a structure in which the variable resistance layer 121 is sandwiched between the lower electrode 120 and the upper electrode 122. As the variable resistance layer 121, an oxygen-deficient tantalum oxide (hereinafter expressed as Ta oxide) is used. The oxygen-deficient Ta oxide refers to a tantalum oxide which is less in oxygen content (atom ratio: ratio of oxygen atom number to total atom number) than a tantalum oxide having a stoichiometric composition. Generally, an oxide having a stoichiometric composition is an insulator or has a very high resistance value. In the case of the Ta oxide, a stoichiometric oxide composition is $Ta_2O_5$, and a ratio (O/Ta) of atom number between Ta and O is 2.5. Therefore, in the oxygen-deficient Ta oxide, the atom ratio between Ta and O is greater than 0 and smaller than 2.5.

The upper electrode 122 and the lower electrode 120 sandwich the variable resistance layer 121. Iridium (Ir) is used as the upper electrode 122, while tantalum nitride (TaN) is used as the lower electrode 120. The variable resistance element 150 is a bipolar variable resistance element.

By applying predetermined electric pulses (electric pulses which are different in polarity and in which absolute values of voltages are predetermined values) which are different in polarity, to the variable resistance layer 121 comprising the above stated Ta oxide, the variable resistance layer 121 reversibly changes its resistance state between a higher-resistance state and a lower-resistance state. When a first electric pulse which has a first polarity and in which an absolute value of a voltage is a first value is applied to the upper electrode 122 on the basis of the lower electrode 120, the variable resistance element 150 changes from the lower-resistance state (electric resistance between the lower electrode 120 and the upper electrode 122 is smaller) to the higher-resistance state (electric resistance between the lower electrode 120 and the upper electrode 122 is greater). On the other hand, when a second electric pulse which has a second polarity different from the first polarity and in which an absolute value of a voltage is a second value (may be equal to or different from the first value) is applied to the upper electrode 122 on the basis of the lower electrode 120, the variable resistance element 150 changes from the higher-resistance state to the lower-resistance state. This is called bipolar resistance change. By combining the bipolar variable resistance element with the bipolar (bidirectional) current steering element, it becomes possible to configure the non-volatile memory element 160 of the present Modified example.

The variable resistance layer 121 is not limited to the oxygen-deficient Ta oxide. Oxygen-deficient oxide layers of transition metals such as nickel (Ni), niobium (Nb), titanium (Ti), zirconium (Zr), hafnium (Hf), cobalt (Co), iron (Fe), copper (Cu), chromium (Cr) and the like, may be used as variable resistance layer. Ir, Pt, Pd, Ag, Cu, and the like and alloy of these may be used as the lower electrode 120 and the upper electrode 122 of the variable resistance element. The current steering element may be positioned below the variable resistance element.

Embodiment 2

[Configuration]

Figure 15A:
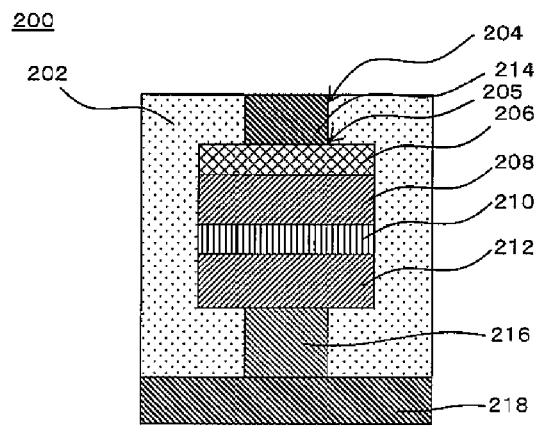
FIG. 15A is a view showing an exemplary schematic configuration of a current steering element according to Embodiment 2, and is a cross-sectional view taken along A-A' of FIG. 15C.
Figure 15B:
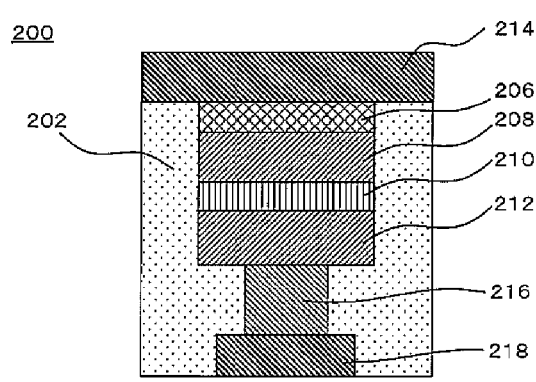
FIG. 15B is a view showing the exemplary schematic configuration of the current steering element according to Embodiment 2, and is a cross-sectional view taken along B-B' of FIG. 15C.
Figure 15C:
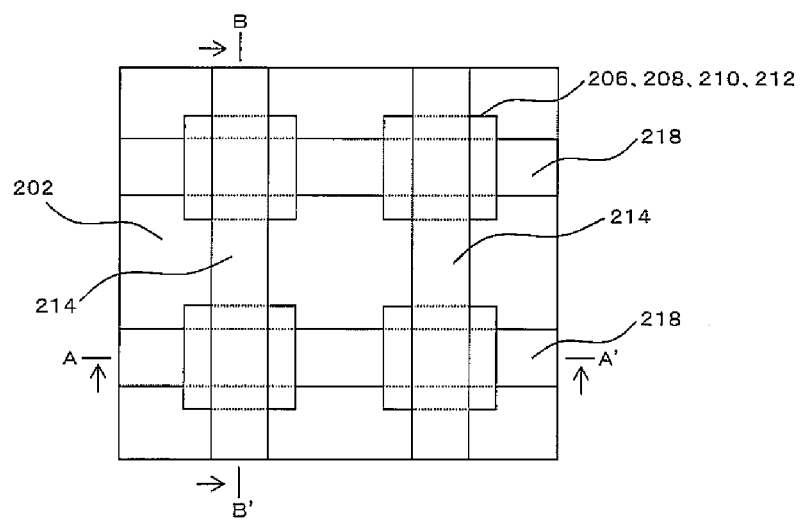
FIG. 15C is a plan view showing the exemplary schematic configuration of the current steering element according to Embodiment 2, when viewed from a thickness direction of an interlayer insulating layer.

FIG. 15 is a view showing an exemplary schematic configuration of a current steering element according to the present embodiment of the present invention. FIG. 15A is a cross-sectional view taken along A-A' of FIG. 15C. FIG. 15B is a cross-sectional view taken along B-B' of FIG. 15C. FIG. 15C is a plan view, when viewed from a thickness direction of an interlayer insulating layer.

As shown in FIGS. 15A and 15B, a current steering element 200 includes a lower wire 218, a first electrode layer 212 electrically connected to the lower wire 218, a current steering layer 210 formed on the first electrode layer 212 such that the current steering layer 210 is physically in contact with the first electrode layer 212, a second electrode layer 208 formed on the current steering layer 210 such that the second electrode layer 208 is physically in contact with the current steering layer 210, a corrosion-suppressing layer 206 formed on the second electrode layer 208 and comprising a material different from a material of the second electrode layer, and an upper wire 214 filled inside a trench 204 formed in an interlayer insulating layer 202 such that the corrosion-suppressing layer 206 is exposed in a lower opening 205 of the trench 214. The first electrode layer 212, the current steering layer 210 and the second electrode layer 208 constitute one of a MSM diode and a MIM diode. The second electrode layer 208 is electrically connected to the upper wire 214 via the corrosion-suppressing layer 206, and the upper electrode layer 208 and the upper wire 214 are not physically in contact with each other.

In the example of FIGS. 15A and 15B, the upper wire 214 and the corrosion-suppressing layer 206 are physically in contact with each other, while the corrosion-suppressing layer 206 and the second electrode layer 208 are physically in contact with each other. Although the lower wire 218 and the first electrode layer 212 are electrically connected to each other via the contact plug 216, the contact plug 216 is not essential, but may be omitted. The lower wire 218 and the first electrode layer 212 may be configured as an identical constituent.

The "trench" refers to an elongated line-shaped opening. Preferably, a plurality of current steering elements 200 may be formed under one trench.

In the example of FIG. 15C, the corrosion-suppressing layer 206 protrudes outward over the upper wire 214 in a short-side direction of the upper wire 214 when viewed from a thickness direction of the interlayer insulating layer 202. Or, the corrosion-suppressing layer 206 may be entirely covered with the upper wire 214 when viewed from the thickness direction of the interlayer insulating layer 202. Or, the upper wire 214 may protrude outward from the corrosion-suppressing layer 206 in a short-side direction of the corrosion-suppressing layer 206 when viewed from the thickness direction of the interlayer insulating layer 202.

As shown in FIG. 15C, the current steering elements of the present embodiment may be formed at cross-points, respectively, at which a plurality of lower wires 218 extending in parallel with each other along a first direction in a first plane intersect a plurality of upper wires 214 extending in parallel with each other along a second direction crossing the first direction in a second plane parallel to the first plane, respectively.

The upper wire 214 may comprise an electric conductive layer containing Cu as a major component. A width of the upper wire may be, for example, 250 nm, and a thickness of the upper wire may be, for example, 300 nm.

The first electrode 212, the current steering layer 210, the second electrode layer 208, the corrosion-suppressing layer 206, the interlayer insulating layer 202, the lower wire 218 and the contact plug 216 may be configured like the first electrode 112, the current steering layer 110, the second electrode layer 108, the corrosion-suppressing layer 106, the interlayer insulating layer 102, the lower wire 118 and the contact plug 116, respectively, and will not be described in detail repetitively.

[Manufacturing Method]

Figure 16A:
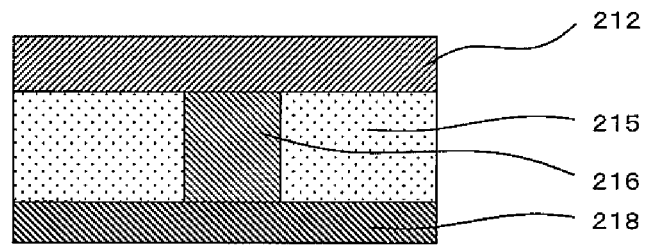
FIG. 16A is a view showing the step of forming a first electrode layer in an exemplary manufacturing method of the current steering element according to Embodiment 2.
Figure 16B:
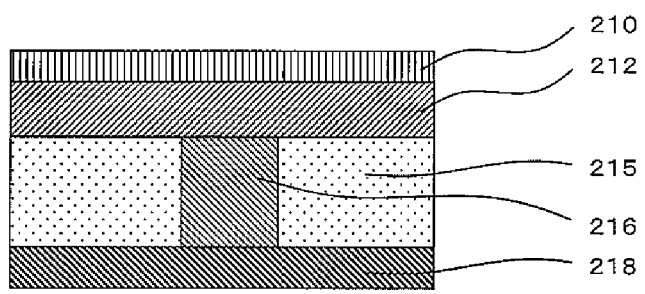
FIG. 16B is a view showing the step of forming the current steering layer on the first electrode layer such that the current steering layer physically contacts the first electrode layer, in the exemplary manufacturing method of the current steering element according to Embodiment 2.
Figure 16C:
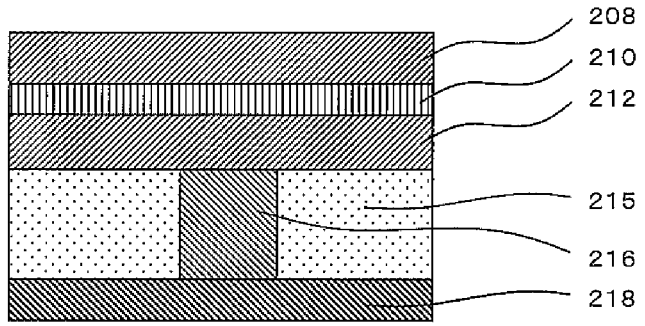
FIG. 16C is a view showing the step of forming a second electrode layer on the current steering layer such that the second electrode layer physically contacts the current steering layer, in the exemplary manufacturing method of the current steering element according to Embodiment 2.
Figure 17A:
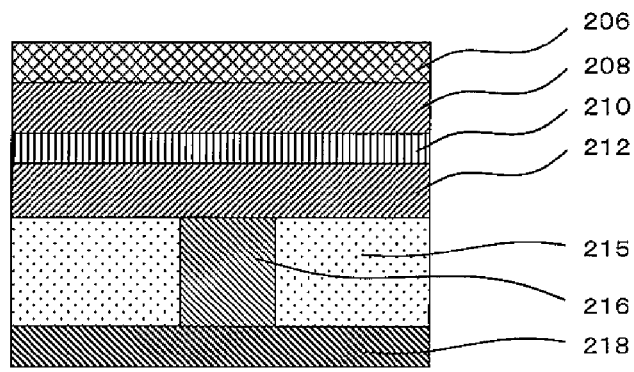
FIG. 17A is a view showing the step of forming a corrosion-suppressing layer on the second electrode layer using a material different from a material of the second electrode layer, in the exemplary manufacturing method of the current steering element according to Embodiment 2.
Figure 17B:
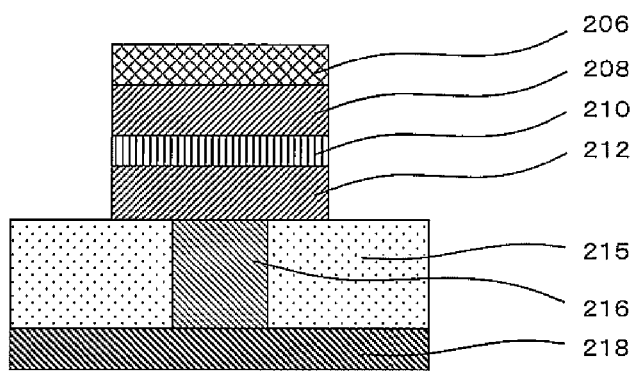
FIG. 17B is a view showing the step of patterning the first electrode layer, the current steering layer, the second electrode layer, and the corrosion-suppressing layer in the exemplary manufacturing method of the current steering element according to Embodiment 2.

FIGS. 16, 17, and 18 are views showing an exemplary manufacturing method of the current steering element according to Embodiment 2 of the present invention. Hereinafter, the manufacturing method of the current steering element of the present embodiment will be described with reference to FIGS. 16, 17, and 18.

The steps of FIGS. 16A, 16B, 16C, 17A, 17B, and 17C may be similar to the steps of FIGS. 4A, 4B, 4C, 5A, 5B, and 5C in Embodiment 1, and therefore, will not be described in detail repetitively.

Figure 17C:
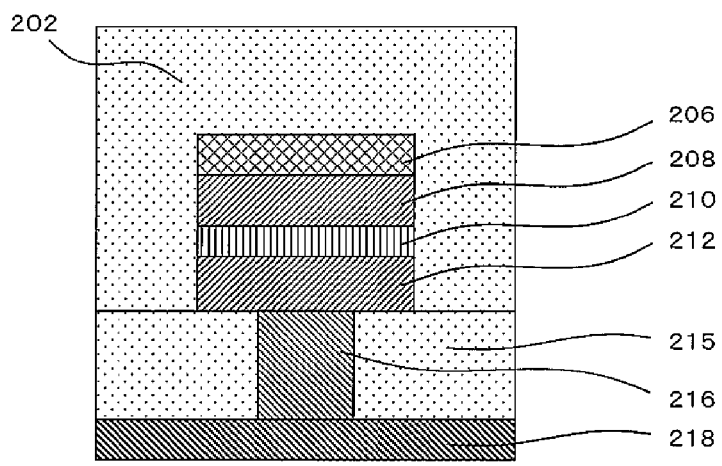
FIG. 17C is a view showing the step of forming an interlayer insulating layer such that the interlayer insulating layer covers the corrosion-suppressing layer in the exemplary manufacturing method of the current steering element according to Embodiment 2.
Figure 18A:
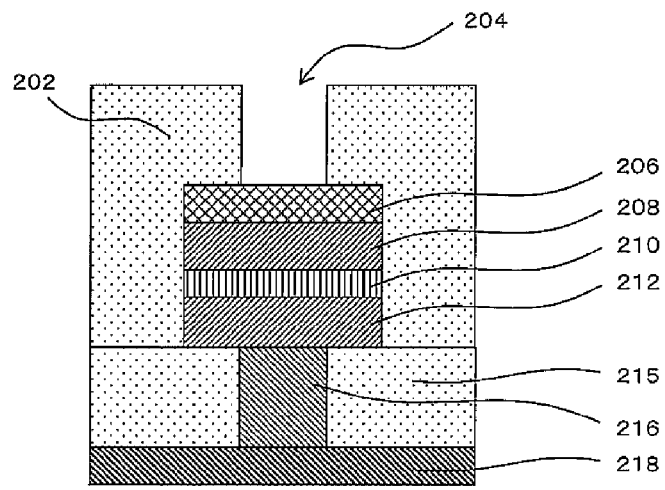
FIG. 18A is a view showing the step of forming a trench in the interlayer insulating layer such that the corrosion-suppressing layer is exposed in a lower opening of the trench in the exemplary manufacturing method of the current steering element according to Embodiment 2.

After the step of FIG. 17C, as shown in FIG. 18A, the trench 204 is formed in the interlayer insulating layer 202 such that the corrosion-suppressing layer 206 is exposed and the second electrode 208 is not exposed in the lower opening of the trench 204 (step of forming the trench in the interlayer insulating layer such that the corrosion-suppressing layer is exposed in the lower opening of the trench). At this time, preferably, a height from the substrate to a bottom of the trench 204 is constant and conforms to a height from the substrate to an upper end of the corrosion-suppressing layer 206.

Figure 18B:
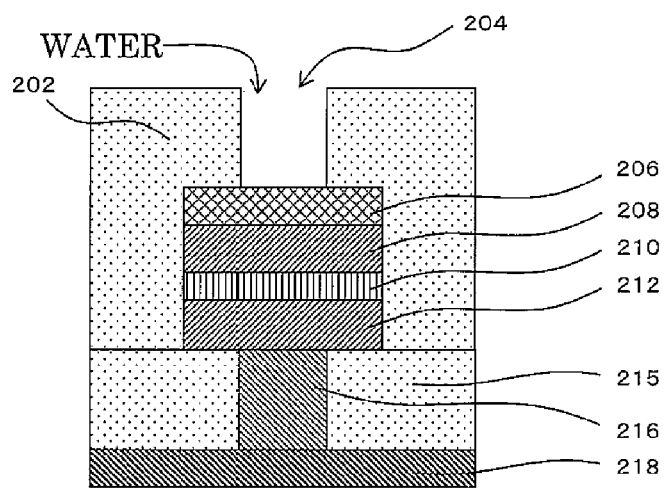
FIG. 18B is a view showing the step of washing an interior of the trench using a washing liquid containing water in the exemplary manufacturing method of the current steering element according to Embodiment 2.

Then, as shown in FIG. 18B, an interior of the trench 204 is washed by using a washing liquid containing water (step of washing the interior of the trench using the washing liquid containing water).

Figure 18C:
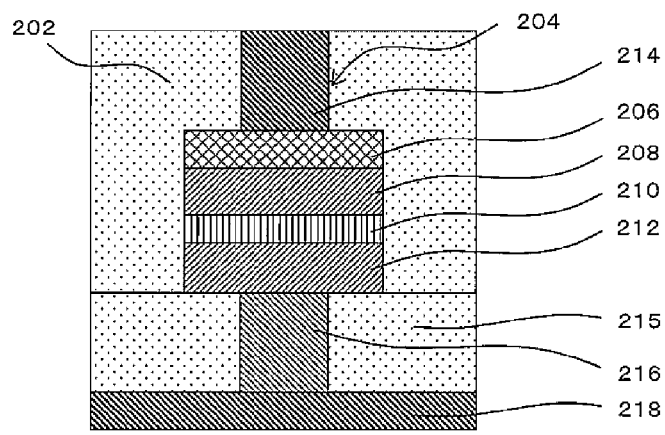
FIG. 18C is a view showing the step of forming an upper wire inside of the trench in the exemplary manufacturing method of the current steering element according to Embodiment 2.

Then, as shown in FIG. 18C, the upper wire 214 is formed inside of the trench 204 (step of forming the upper wire inside of the trench). Specifically, for example, Ti of 10 nm as an adhesive layer, and TiN of 10 nm as a barrier layer for W which is a major material of the wire, are sequentially deposited by the CVD into the via hole 104, and then tungsten is filled into the via hole 104 by the CVD. Instead of tungsten, for example, copper may be used. In that case, the barrier layer (e.g., Ta or TaN) for copper is formed firstly. Note that the step of FIG. 18C is not essential, but may be omitted.

MODIFIED EXAMPLE

Figure 19A:
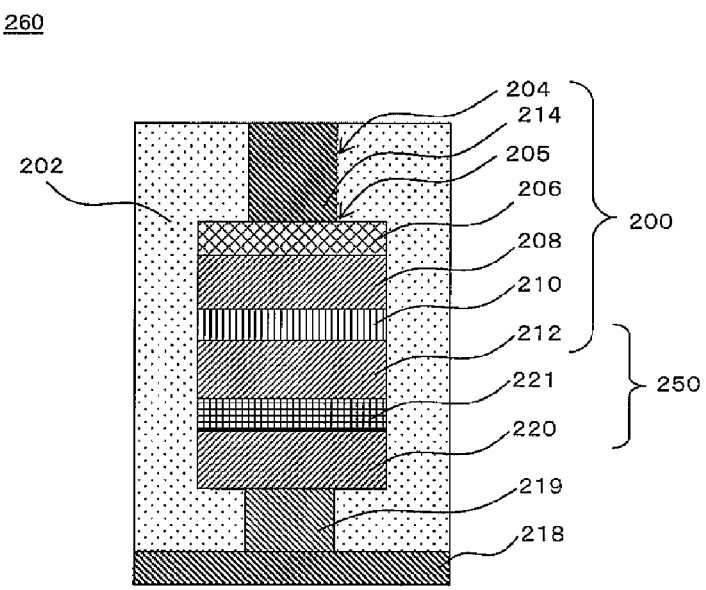
FIG. 19A is a cross-sectional view showing an exemplary schematic configuration of a non-volatile memory element according to Modified example of Embodiment 2.
Figure 19B:
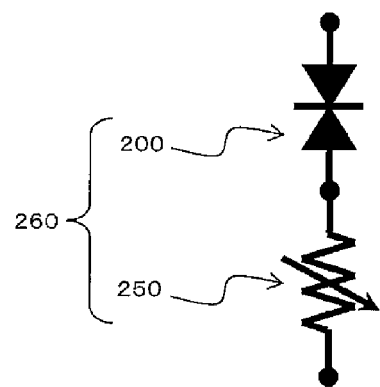
FIG. 19B is an equivalent circuit diagram of FIG. 19A.

FIG. 19 is a view showing an exemplary schematic configuration of a non-volatile memory element according to Modified example of Embodiment 2. FIG. 19A is a cross-sectional view and FIG. 19B is an equivalent circuit diagram of FIG. 19A.

As shown in FIG. 19, in the present Modified example, the current steering element of the present embodiment is combined with a bipolar variable resistance element 250 (e.g., comprising a lower electrode 220, a variable resistance layer 221, and an upper electrode) which reversibly changes its resistance state between a higher-resistance state and a lower-resistance state by application of two electric pulses which are different in polarity. In this configuration, by utilizing the current steering element of the present embodiment, as a bidirectional current steering element, it becomes possible to implement a cross-point non-volatile memory element 260 including the bipolar variable resistance element 250.

The first electrode layer 212 of the current steering element and the upper electrode of the variable resistance element 250 are configured as an identical constituent. That is, the first electrode 212 serves as the upper electrode of the variable resistance element 250. The first electrode layer 212 and the upper electrode of the variable resistance element 250 may be configured as different constituents. A contact plug may be provided between the first electrode layer 212 and the upper electrode of the variable resistance element 250. Although the lower electrode 220 of the variable resistance element 250 is connected to the lower wire 218 via the contact plug 219, the contact plug 219 may be omitted. The lower wire 218 may be, for example, a word line, while the upper wire 214 may be, for example, a bit line.

The bipolar non-volatile memory element 260 may be identical in configuration to the non-volatile memory element 160 according to the Modified example of Embodiment 1 except for the above stated configuration, and therefore, will not be described in detail repetitively.

Numeral modifications and alternative embodiments of the present invention can be made by those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

Industrial Applicability

A current steering element and a non-volatile memory element of the present invention are advantageously incorporated into a non-volatile memory device for use with electronic devices such as a personal computer and a cellular phone.

REFERENCE SINGS LISTS 100 current steering element
102 interlayer insulating layer
103 upper wire
104 via hole
105 lower opening
106 corrosion-suppressing layer
108 second electrode layer
110 current steering layer
112 first electrode layer
114 contact plug
115 interlayer insulating layer
116 contact plug
118 lower wire
119 contact plug
120 lower electrode
121 variable resistance layer
122 upper electrode 150 variable resistance element
160 non-volatile memory element

The invention claimed is:

1. A method of manufacturing a current steering element comprising the steps of:
   forming a lower wire;
   forming a first electrode layer such that the first electrode layer is electrically connected to the lower wire;
   forming a current steering layer on the first electrode layer such that the current steering layer physically contacts the first electrode layer;
   forming a second electrode layer on the current steering layer such that the second electrode layer physically contacts the current steering layer;
   forming a corrosion-suppressing layer on the second electrode layer using a material having a higher standard electrode potential than a material of the second electrode layer;
   forming an interlayer insulating layer such that the interlayer insulating layer covers the corrosion-suppressing layer, the second electrode layer, the current steering layer and the first electrode layer;
   forming a via hole in the interlayer insulating layer such that an entire portion of the lower opening of the via hole opens on the corrosion-suppressing layer; and
   washing an interior of the via hole using a washing liquid containing water.

2. A method of manufacturing a current steering element comprising the steps of:
   forming a lower wire;
   forming a first electrode layer such that the first electrode layer is electrically connected to the lower wire;
   forming a current steering layer on the first electrode layer such that the current steering layer physically contacts the first electrode layer;
   forming a second electrode layer on the current steering layer such that the second electrode layer physically contacts the current steering layer;
   forming a corrosion-suppressing layer on the second electrode layer using a material having a higher standard electrode potential than a material of the second electrode layer;
   forming an interlayer insulating layer such that the interlayer insulating layer covers the corrosion-suppressing layer, the second electrode layer, the current steering layer and the first electrode layer;
   forming a trench in the interlayer insulating layer such that the corrosion-suppressing layer is exposed and the second electrode layer is not exposed in a lower opening of the trench; and
   washing an interior of the trench using a washing liquid containing water.

3. The method of manufacturing the current steering element according to claim 1,
   wherein in the step of forming the via hole, the via hole is formed such that the corrosion-suppressing layer protrudes outward over an entire outer periphery of the lower opening of the via hole when viewed from a thickness direction of the interlayer insulating layer.

4. The method of manufacturing the current steering element according to claim 1, wherein in the step of forming the corrosion-suppressing layer, the corrosion-suppressing layer is formed using a material having a standard electrode potential which is equal to or higher than 0.

5. The method of manufacturing the current steering element according to claim 1, wherein in the step of forming the corrosion-suppressing layer, the corrosion-suppressing layer is formed using precious metal.

6. The method of manufacturing the current steering element according to claim 1, wherein in the step of forming the corrosion-suppressing layer, the corrosion-suppressing layer is formed using a metal oxide having an electric conductivity.

7. The method of manufacturing the current steering element according to claim 1, wherein in the step of forming the first electrode layer, the first electrode layer is formed using at least one material selected from a group consisting of tantalum nitride, titanium nitride, tungsten, and a metal oxide;
   wherein in the step of forming the current steering layer, the current steering layer is formed using silicon nitride; and
   wherein in the step of forming the second electrode layer, the first electrode layer is formed using at least one material selected from a group consisting of tantalum nitride, titanium nitride, tungsten, and a metal oxide.

8. A method of manufacturing a non-volatile memory element comprising:
   forming the current steering element by the method of manufacturing the current steering element as recited in claim 1; and
   forming a bipolar variable resistance element which is connected in series with the current steering element and reversibly changes its resistance state between a higher-resistance state and a lower-resistance state by application of two electric pulses which are different in polarity.

9. The method of manufacturing the current steering element according to claim 1,
   wherein in the step of forming the current steering layer, the current steering layer is formed using a semiconductor; and
   wherein the first electrode layer, the current steering layer, and the second electrode layer constitute a MSM diode.

10. The method of manufacturing the current steering element according to claim 2, wherein in the step of forming the corrosion-suppressing layer, the corrosion-suppressing layer is formed using a material having a standard electrode potential which is equal to or higher than 0.

11. The method of manufacturing the current steering element according to claim 2, wherein in the step of forming the corrosion-suppressing layer, the corrosion-suppressing layer is formed using precious metal.

12. The method of manufacturing the current steering element according to claim 2, wherein in the step of forming the corrosion-suppressing layer, the corrosion-suppressing layer is formed using a metal oxide having an electric conductivity.

13. The method of manufacturing the current steering element according to claim 2, wherein in the step of forming the first electrode layer, the first electrode layer is formed using at least one material selected from a group consisting of tantalum nitride, titanium nitride, tungsten, and a metal oxide;
   wherein in the step of forming the current steering layer, the current steering layer is formed using silicon nitride; and
   wherein in the step of forming the second electrode layer, the first electrode layer is formed using at least one material selected from a group consisting of tantalum nitride, titanium nitride, tungsten, and a metal oxide.

14. A method of manufacturing a non-volatile memory element comprising:
   forming the current steering element by the method of manufacturing the current steering element as recited in claim 2; and
   forming a bipolar variable resistance element which is connected in series with the current steering element and reversibly changes its resistance state between a higher-resistance state and a lower-resistance state by application of two electric pulses which are different in polarity.

15. The method of manufacturing the current steering element according to claim 2,
wherein in the step of forming the current steering layer, the current steering layer is formed using a semiconductor; and
wherein the first electrode layer, the current steering layer, and the second electrode layer constitute a MSM diode.

* * * * *